United States Patent
Ren et al.

(10) Patent No.: US 11,671,017 B2
(45) Date of Patent: Jun. 6, 2023

(54) CURRENT BALANCING FOR VOLTAGE REGULATOR UNITS IN FIELD PROGRAMMABLE ARRAYS

(71) Applicant: QUALCOMM Incorporated, San Diego, CA (US)

(72) Inventors: Gang Ren, Vancouver, WA (US); Peng Zou, Camas, WA (US); Syrus Ziai, Los Altos, CA (US); Curtis Roger McAllister, Los Altos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/534,362

(22) Filed: Nov. 23, 2021

(65) Prior Publication Data
US 2022/0247315 A1    Aug. 4, 2022

Related U.S. Application Data

(60) Provisional application No. 63/143,734, filed on Jan. 29, 2021, provisional application No. 63/143,732, filed on Jan. 29, 2021.

(51) Int. Cl.
*H02J 1/14*   (2006.01)
*H02M 1/08*   (2006.01)
(Continued)

(52) U.S. Cl.
CPC .............. *H02M 3/1584* (2013.01); *H02J 1/14* (2013.01); *H02M 1/0009* (2021.05); *H02M 1/08* (2013.01); *H02M 3/003* (2021.05); *H01L 25/18* (2013.01)

(58) Field of Classification Search
CPC ......... H01L 25/18; H02J 1/14; H02M 1/0009; H02M 1/08; H02M 3/003; H02M 3/1584
(Continued)

(56) References Cited

U.S. PATENT DOCUMENTS 6,314,009 B1    11/2001   Dittmer et al.
6,495,995 B2 *  12/2002   Groom ................. H02M 3/1584
                                                            323/283
(Continued)

FOREIGN PATENT DOCUMENTS

KR    20140137924 A    12/2014
WO    2016007223 A1    1/2016

OTHER PUBLICATIONS

International Search Report and Written Opinion for International Patent Application No. PCT/US2021/060851, dated Mar. 2, 2022, 13 pages.

*Primary Examiner* — William Hernandez
(74) *Attorney, Agent, or Firm* — W & T

(57) ABSTRACT

A semiconductor device has a power rail that provides a rail voltage. The power rail is electrically coupled to a plurality of voltage regulators, and each voltage regulator includes an output interface electrically coupled to the power rail, and a first drive path and a second drive path both coupled to the output interface, and an intra-regulator balancing circuit. The first and second drive paths are coupled in parallel with each other, and operate during a first phase and a second phase, at an operating frequency, to provide a first path current and a second path current to the power rail, respectively. The intra-regulator balancing circuit senses the first and second path currents and controls a first duty cycle of the first phase and/or a second duty cycle of the second phase based on a difference of the first and second path currents.

20 Claims, 16 Drawing Sheets

(51) Int. Cl.
  *H02M 3/158* (2006.01)
  *H02M 1/00* (2006.01)
  *H02M 3/00* (2006.01)
  *H01L 25/18* (2023.01)

(58) Field of Classification Search
  USPC .................................................... 307/43, 52
  See application file for complete search history.

(56) References Cited

U.S. PATENT DOCUMENTS

| | | | |
|---|---|---|---|
| 6,683,441 B2 * | 1/2004 | Schiff | H02M 3/1584 |
| | | | 323/224 |
| 6,850,045 B2 | 2/2005 | Muratov et al. | |
| 7,007,176 B2 | 2/2006 | Goodfellow et al. | |
| 7,772,821 B2 | 8/2010 | Liu et al. | |
| 8,710,810 B1 | 4/2014 | McJimsey et al. | |
| 8,878,501 B2 * | 11/2014 | Kalje | H02M 3/1584 |
| | | | 323/272 |
| 9,621,045 B2 * | 4/2017 | Tang | G01R 19/04 |
| 9,748,830 B1 | 8/2017 | Soleno et al. | |
| 2004/0145360 A1 * | 7/2004 | Pearce | H02M 3/1584 |
| | | | 323/283 |
| 2005/0010825 A1 * | 1/2005 | Pullen | H02M 3/1584 |
| | | | 713/300 |
| 2006/0242435 A1 | 10/2006 | Swope | |
| 2007/0200538 A1 * | 8/2007 | Tang | H02M 3/1584 |
| | | | 323/237 |
| 2007/0279950 A1 | 12/2007 | Sugiyama et al. | |
| 2008/0111534 A1 | 5/2008 | Ravichandran | |
| 2010/0257388 A1 | 10/2010 | Green et al. | |
| 2014/0167711 A1 | 6/2014 | Thenus et al. | |
| 2015/0022173 A1 | 1/2015 | Le et al. | |
| 2015/0370298 A1 | 12/2015 | Henzler et al. | |
| 2016/0124478 A1 | 5/2016 | Beeston et al. | |
| 2016/0209905 A1 | 7/2016 | Kelly et al. | |
| 2016/0239036 A1 | 8/2016 | Paillet et al. | |
| 2016/0334819 A1 | 11/2016 | Pelicia et al. | |
| 2017/0147050 A1 | 5/2017 | Berke et al. | |
| 2019/0384337 A1 | 12/2019 | Lu et al. | |
| 2020/0176971 A1 | 6/2020 | Batenburg et al. | |
| 2020/0225689 A1 | 7/2020 | Vannorsdel et al. | |
| 2020/0264214 A1 | 8/2020 | Schrom et al. | |
| 2020/0293073 A1 | 9/2020 | Morroni | |
| 2020/0333386 A1 | 10/2020 | Bennett et al. | |
| 2020/0388307 A1 | 12/2020 | Rowley | |
| 2020/0411069 A1 | 12/2020 | Rowley | |
| 2022/0247314 A1 | 8/2022 | Zou et al. | |

* cited by examiner

CURRENT BALANCING FOR VOLTAGE REGULATOR UNITS IN FIELD PROGRAMMABLE ARRAYS

RELATED APPLICATIONS

This application claims priority to U.S. Provisional Patent Application No. 63/143,732, titled "Power Management Integrated Circuit with a Field Programmable Array of Voltage Regulators," filed on Jan. 29, 2021, and U.S. Provisional Patent Application No. 63/143,734, titled "Current Balancing for Voltage Regulator Units in Field Programmable Arrays," filed on Jan. 29, 2021, each of which is hereby incorporated by reference in its entirety.

This application is related to U.S. patent application Ser. No. 17/534,345, titled "Power Management Integrated Circuit with a Field Programmable Array of Voltage Regulators," filed on Nov. 23, 2021, which is hereby incorporated by reference in its entirety.

TECHNICAL FIELD

This application relates generally to electronic devices including, but not limited to, devices and methods for adaptively driving power rails of an electronic system.

BACKGROUND

An electronic device oftentimes integrates a system on a chip (SoC) with a power management integrated circuit (PMIC), communication ports, external memory or storage, and other peripheral function modules on a main logic board. The SoC includes one or more microprocessor or central processing unit (CPU) cores, memory, input/output ports, and secondary storage in a single package. The PMIC is typically disposed adjacent to the SoC on the main logic board, and provides multiple direct current (DC) power supply rails to the SoC via conductive wires formed on the main logic board. For each type of SoC, the PMIC and the conductive wires leading to the SoC need to be custom-designed based on at least the microprocessor or CPU cores included in the type of SoC. Customization of the PMIC for each SoC type is not efficient in many situations. Additionally, in some situations, voltage regulators in the same PMIC are not balanced and compromise performance of the PMIC. It would be beneficial to provide highly balanced voltage regulators, e.g., for use in an efficient and high performance PMIC solution that can be configured to drives different types of SoCs.

SUMMARY

To address issues associated with custom-designed PMICs, it would be highly desirable to provide a semiconductor device or system with a generic PMIC that can adaptively support a variety of different types of SoCs having different microprocessor or CPU cores. Particularly, the generic PMIC that utilizes voltage regulators that are balanced individually and mutually to enable high performance of the generic PMIC.

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to provide a semiconductor device that is configured to provide a plurality of power rails to power one or more clusters of processors of an SoC. The semiconductor device includes a plurality of voltage regulators, arranged in a field programmable array, and controlled to output power to the plurality of power rails of the SoC based on load information that is associated with the one or more clusters of processors coupled to the power rails. Stated another way, the same semiconductor device is configurable to drive different types of SoCs based on their load information and becomes a generic SoC powering solution.

In some embodiments, for each power rail, intra-regulator and/or inter-regulator current balancing mechanisms are applied internally in each active voltage regulator that drives the respective power rail, such that path currents in different current paths of each active voltage regulator are balanced and output currents in different active voltage regulators driving the respective power rail are balanced. These balancing mechanisms are efficiently implemented for each individual voltage regulator (e.g., of a generic PMIC circuit) without involving inputs or controls from other distinct voltage regulators. Additionally, a voltage regulator in the field programmable array can be electrically decoupled from the plurality of power rails and become a redundant voltage regulator without being entirely powered down, when a bypass unit is used to disable a feedback path between an output interface and an input of the redundant voltage regulator.

Specifically, in one aspect, an integrated semiconductor device includes a plurality of voltage regulators and a power array controller. The plurality of voltage regulators is arranged in a field programmable array. The power array controller is coupled to the plurality of voltage regulators, and configured to control the plurality of voltage regulators to output power to a plurality of power rails. Each power rail provides a respective rail current at a respective rail voltage. For each of the plurality of power rails, the power array controller is configured to determine the respective rail current associated with the respective power rail, select a subset of voltage regulators according to at least the respective rail current, and enable the subset of voltage regulators to generate the respective rail voltage and provide the respective rail current collectively. In some embodiments, the power array controller includes one or more processors and memory having instructions stored thereon, which when executed by the one or more processors cause the processors to control the plurality of voltage regulators to output power to the plurality of power rails.

In some embodiments, the power array controller is configured to determine a control value based on at least the respective rail voltage, and to enable the subset of voltage regulators to generate, in accordance with the determined control value, the respective rail voltage and provide the respective rail current collectively. Further, in some embodiments, enabling the subset of voltage regulators further comprises providing the control value to the subset of voltage regulators. The subset of voltage regulators is controlled by the control value to generate the respective rail voltage and provide the respective rail current collectively. Additionally, in some embodiments, enabling the subset of voltage regulators further includes providing an operation enable signal to the selected subset of voltage regulators to generate the respective rail voltage and provide the respective rail current collectively.

In some embodiments, the power array controller is configured to determine the respective rail current associated with the respective power rail in accordance with load information corresponding to an anticipated or actual load on the respective power rail load. Further, in some embodiments, the load information corresponds to processor load information for one or more clusters of processors coupled to the respective power rail.

In some embodiments, the integrated semiconductor device further includes one or more direct current (DC) power supply interfaces. Each DC power supply interface is configured to receive a distinct DC supply voltage, and each voltage regulator is coupled to a respective subset of the one or more DC power supply interfaces and configured to be powered by a corresponding DC supply voltage and generate the respective rail voltage from the corresponding DC supply voltage.

In some embodiments, at a respective time, at least one of the plurality of voltage regulators is redundant and not coupled to any of the plurality of power rails.

In some embodiments, selecting the subset of voltage regulators for each power rail further includes uniquely associating each of the subset of voltage regulators with the respective power rail at a respective time.

In some embodiments, for each power rail, the respective rail current has a maximum rail current $I_{RLM}$. Each of the subset of voltage regulators is configured to provide a regulator current up to a maximum regulator current $I_{RGM}$, and the subset of voltage regulators has a first number of voltage regulators corresponding to a ratio of the maximum rail current $I_{RLM}$ and the maximum regulator current $I_{RGM}$. Further, in some embodiments, a first power rail is configured to reach the respective rail voltage within a transient load response time at each startup of the first power rail, and the transient load response time is enabled by the maximum regulator current $I_{RGM}$. The first number is determined based on the transient load response time. Additionally, a second power rail is configured to reach the respective rail voltage within a transient load response time at each startup of the second power rail and output the maximum rail current $I_{RLM}$ during normal operation, the transient load response time is enabled by a transient load current that is less than the maximum rail current $I_{RLM}$. In some embodiments, the power array controller is configured to, for each power rail, determine an instant rail current of the respective power rail and enable all of the subset of voltage regulators to provide the instant rail current of the respective power rail collectively. In some embodiments, the power array controller is configured to, for each power rail, determine an instant rail current of the respective power rail, compare the instant rail current and the maximum regulator current $I_{RGM}$, disable one or more voltage regulators in the subset of voltage regulators, and enable a remainder of the subset of the voltage regulators to provide the instant rail current of the respective power rail collectively.

In some embodiments, the plurality of voltage regulators are identical to each other.

In some embodiments, each of the plurality of voltage regulators corresponds to a respective voltage regulator type selected from a plurality of predefined voltage regulator types. For each power rail, the subset of voltage regulators corresponds to a respective voltage regulator type, and selecting the subset of voltage regulators includes determining the respective voltage regulator type based on at least one performance criterion.

In some embodiments, for each power rail, each of the subset of voltage regulator further includes an output interface, one or more drive paths, and a voltage regulator controller. The output interface is coupled to the respective power rail and configured to provide the rail voltage and deliver the respective rail current to the respective power rail. The one or more drive paths is coupled to the output interface and configured to operate with an operating frequency. The voltage regulator controller has an output coupled to the one or more drive paths and an input coupled to the output interface by a feedback path, and is configured to control the one or more drive paths.

In some embodiments, for each power rail, each of the subset of voltage regulator further includes a bypass unit coupled to the one or more drive paths and the voltage regulator controller. The bypass unit is configured to provide a dummy load component. The respective voltage regulator has a standby/redundancy mode in which the bypass unit is enabled to bypass the feedback path from the output interface to the input of the voltage regulator controller, thereby disabling the respective voltage regulator from contributing to the respective rail current.

In some embodiments, for each power rail, each voltage regulator in the subset of voltage regulators is configured to provide a portion of the respective rail current, and further includes an output interface electrically coupled to the respective power rail, a plurality of drive paths, and at least one of an intra-regulator balancing circuit and an inter-regulator balancing circuit. Each drive path is coupled to the output interface and configured to provide a respective path current to the respective power rail. The intra-regulator balancing circuit is coupled to the plurality of drive paths and configured to balance the respective path currents of the plurality of drive paths; and the inter-regulator balancing circuit is coupled to the output interface and configured to balance the portion of the respective rail current provided by the respective voltage regulator with at least another portion of the respective rail current provided by a distinct voltage regulator in the subset of voltage regulators. Further, in some embodiments, for each power rail, each voltage regulator in the subset of voltage regulators includes both the intra-regulator balancing circuit and the inter-regulator balancing circuit.

In another aspect, an integrated semiconductor device includes a power rail and a plurality of voltage regulators electrically coupled to the power rail. The power rail is configured to provide a rail voltage, and the plurality of voltage regulators are configured to provide the rail voltage collectively. Each of the plurality of voltage regulators includes an output interface, a first drive path, a second drive path, and an intra-regulator balancing circuit. The output interface is electrically coupled to the power rail. The first drive path is coupled to the output interface and configured to operate during a first phase and with an operating frequency to provide a first path current to the power rail. The second drive path is coupled to the output interface and configured to operate during a second phase and with the operating frequency to provide a second path current to the power rail. The second drive path is electrically coupled in parallel with the first drive path. The intra-regulator balancing circuit is coupled to the first and second drive paths and configured to sense the first and second path currents and generate a first control signal to control a first duty cycle of the first phase and/or a second duty cycle of the second phase based on a difference of the first and second path currents.

In some embodiments, each of the plurality of voltage regulators further includes a voltage regulator controller having a feedback input coupled to the output interface. The voltage regulator controller's feedback input is configured to receive an output voltage of the output interface. Each of the plurality of voltage regulators further includes an inter-regulator balancing circuit coupled to the output interface and the voltage regulator controller. The inter-regulator balancing circuit is configured to sense an output current of the respective voltage regulator and apply an offset to a control input of the voltage regulator controller, wherein the offset is determined based on the sensed output current of the respective voltage regulator.

In some embodiments, the intra-regulator balancing circuit is configured to determine that the difference of the first and second path currents does not satisfy a path current balancing criterion, and in accordance with a determination that the difference of the first and second path currents does not satisfy the path current balancing criterion and a determination that the first path current is greater than the second path current, implement one or both of reducing the first duty cycle of the first phase and increasing the second duty cycle of the second phase, until the difference of the first and second path currents satisfies the path current balancing criterion.

In some embodiments, each of the plurality of voltage regulators further includes a voltage regulator controller having a feedback input coupled to the output interface, and the voltage regulator controller's feedback input is configured to receive an output voltage of the output interface. Further, in some embodiments, each of the plurality of voltage regulators further includes an inter-regulator balancing circuit coupled to the output interface and the voltage regulator controller. The inter-regulator balancing circuit is configured to sense an output current of the respective voltage regulator and apply an offset to a control input of the voltage regulator controller. The offset is determined based on the sensed output current of the respective voltage regulator. Additionally, in some embodiments, the voltage regulator controller includes an error amplifier configured to receive the control input and apply the offset between the feedback input and a control value that defines the rail voltage. In some embodiments, each of the plurality of voltage regulators further includes an inter-regulator balancing circuit coupled to the output interface and the voltage regulator controller. The inter-regulator balancing circuit is configured to sense one of the first and second path currents of the respective voltage regulator and apply an offset to a control input received by the voltage regulator controller, the offset based on the sensed one of the first and second path currents.

In some embodiments, each of the first and second drive paths further includes a switching component coupled to an input supply voltage yin and the output interface, and a driver coupled to the switching component and configured to enable the switching component during a respective one of the first and second phases, at the operating frequency, thereby providing a respective one of the first and second path currents to the power rail.

In some embodiments, the first duty cycle of the first phase is equal to the second duty cycle of the second phase, and the second phase is offset from the first phase.

In some embodiments, the first control signal is generated to control the second duty cycle of the second phase based on the difference of the first and second path currents. Each of the plurality of voltage regulators further includes a third drive path coupled to the output interface and configured to operate during a third phase, at the operating frequency, to provide a third path current to the power rail, the third drive path electrically coupled in parallel with the first and second drive paths. The intra-regulator balancing circuit is coupled to the third drive path and configured to sense the third path current and generate a second control signal to control a third duty cycle of the third phase based on a difference of the first and third path currents.

In some embodiments, each of the plurality of voltage regulators further includes a third drive path coupled to the output interface and configured to operate during a third phase, at the operating frequency, to provide a third path current to the power rail, the third drive path electrically coupled in parallel with the first and second drive paths. The intra-regulator balancing circuit is coupled to the third drive path and configured to sense the third path current and generate the first control signal to control the first duty cycle of the first phase based on a difference of the first and second path currents and based on a difference of the first and third path currents.

In some embodiments, the plurality of voltage regulators and one or more additional voltage regulators are arranged in a field programmable array, and the plurality of voltage regulators are selected from the field programmable array to drive the power rail based on load information corresponding to an anticipated or actual load on the power rail.

Further, in another aspect, an integrated semiconductor device includes a power rail and a plurality of voltage regulators coupled to the power rail. The power rail is configured to provide a rail voltage, and the plurality of voltage regulators is configured to provide the rail voltage collectively. Each of the plurality of voltage regulators includes an output interface, one or more drive paths, a voltage regulator controller, and a bypass unit. The output interface is coupled to the power rail and configured to provide the rail voltage and deliver up to a predefined regulator current to the power rail. The one or more drive paths are coupled to the output interface and configured to operate with an operating frequency. The voltage regulator controller has an output coupled to the one or more drive paths and an input coupled to the output interface by a feedback path, and is configured to control the one or more drive paths. The bypass unit is coupled to the one or more drive paths and the voltage regulator controller, and configured to provide a dummy load component. Each voltage regulator has a standby/redundancy mode in which the bypass unit is enabled to bypass the feedback path from the output interface to the input of the voltage regulator controller.

Other embodiments and advantages may be apparent to those skilled in the art in light of the descriptions and drawings in this specification.

BRIEF DESCRIPTION OF THE DRAWINGS

Like reference numerals refer to corresponding parts throughout the drawings.

DESCRIPTION OF EMBODIMENTS

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. For example, it will be apparent to one of ordinary skill in the art that the subject matter presented herein can be implemented on many types of electronic devices with power management capabilities.

Figure 1:
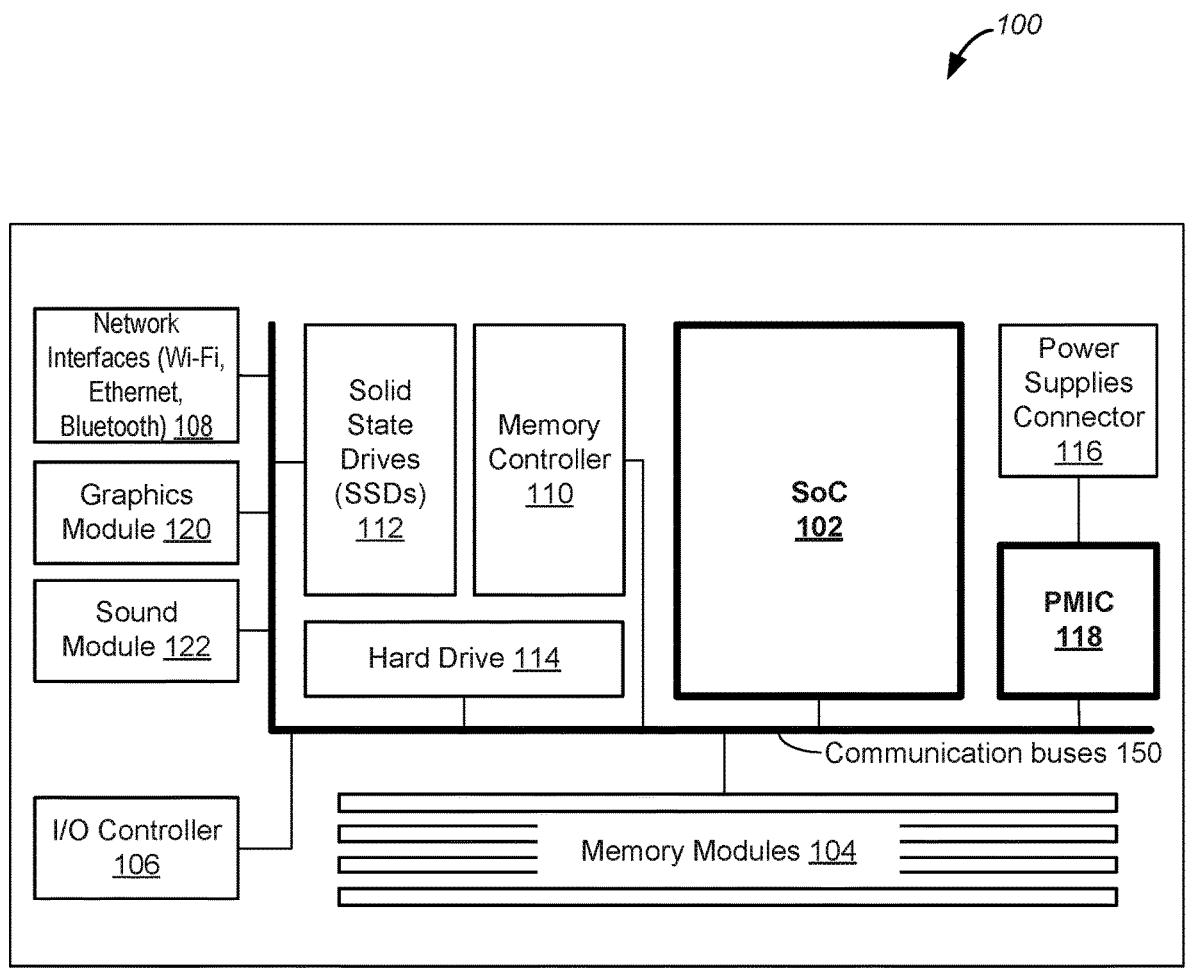
FIG. 1 is a block diagram of an example system module in a typical electronic device, in accordance with some embodiments.

Previously, for each type of SoC, PMIC and conductive wires leading to the SoC need to be custom-designed based on at least microprocessor or CPU cores included in the type of SoC. Customization of the PMIC for each SoC type is not efficient in many situations. Additionally, in some situations, voltage regulators in the same PMIC are not balanced and compromise performance of the PMIC. In various embodiments of this application, an integrated semiconductor device is configured to provide a plurality of power rails to power one or more clusters of processors of an SoC. The semiconductor device includes a plurality of voltage regulators, arranged in a field programmable array, and controlled to output power to the plurality of power rails of the SoC based on load information that is associated with the one or more clusters of processors coupled to the power rails. The same integrated semiconductor device is adjusted to power different types of SoCs. Additionally, in some embodiments, for each power rail, intra-regulator and/or inter-regulator current balancing mechanisms are applied internally in each active voltage regulator that drives the respective power rail, such that path currents in different current paths of each active voltage regulator are balanced and output currents in different active voltage regulators driving the respective power rail are balanced. By these means, this application provides an efficient and high performance PMIC solution that has highly balanced voltage regulators and can adaptively drive different types of SoCs FIG. 1 is a block diagram of an example system module 100 in a typical electronic device, in accordance with some embodiments. System module 100 in this electronic device includes at least a system on a chip (SoC) 102, memory modules 104 for storing programs, instructions and data, an input/output (I/O) controller 106, one or more communication interfaces such as network interfaces 108, and one or more communication buses 150 for interconnecting these components. In some embodiments, I/O controller 106 allows SoC 102 to communicate with an I/O device (e.g., a keyboard, a mouse or a touch screen) via a universal serial bus interface. In some embodiments, network interfaces 108 includes one or more interfaces for Wi-Fi, Ethernet and Bluetooth networks, each allowing the electronic device to exchange data with an external source, e.g., a server or another electronic device. In some embodiments, communication buses 150 include circuitry (sometimes called a chipset) that interconnects and controls communications among various system components included in system module 100.

In some embodiments, memory modules 104 include high-speed random access memory, such as DRAM, SRAM, DDR RAM or other random access solid state memory devices. In some embodiments, memory modules 104 include non-volatile memory, such as one or more magnetic disk storage devices, optical disk storage devices, flash memory devices, or other non-volatile solid state storage devices. In some embodiments, memory modules 104, or alternatively the non-volatile memory device(s) within memory modules 104, include a non-transitory computer readable storage medium. In some embodiments, memory slots are reserved on system module 100 for receiving memory modules 104. Once inserted into the memory slots, memory modules 104 are integrated into system module 100.

In some embodiments, system module 100 further includes one or more components selected from:
- a memory controller 110 that controls communication between SoC 102 and memory components, including memory modules 104, in electronic device;
- solid state drives (SSDs) 112 that apply integrated circuit assemblies to store data in the electronic device, and in many embodiments, are based on NAND or NOR memory configurations;

a hard drive 114 that is a conventional data storage device used for storing and retrieving digital information based on electromechanical magnetic disks;

a power supply connector 116 that includes one or more direct current (DC) power supply interfaces each of which is configured to receive a distinct DC supply voltage;

power management integrated circuit (PMIC) 118 that modulates the distinct DC supply voltages received via the DC power supply interfaces to other desired internal supply voltages, e.g., 5V, 3.3V or 1.8V, as required by various components or circuits (e.g., processor cores in the SoC 102) within electronic device;

a graphics module 120 that generates a feed of output images to one or more display devices according to their desirable image/video formats; and a sound module 122 that facilitates the input and output of audio signals to and from the electronic device under control of computer programs.

It is noted that communication buses 150 also interconnect and control communications among various system components including components 110-122.

Further, one skilled in the art knows that other non-transitory computer readable storage media can be used, as new data storage technologies are developed for storing information in the non-transitory computer readable storage media in the memory modules 104 and in SSDs 112. These new non-transitory computer readable storage media include, but are not limited to, those manufactured from biological materials, nanowires, carbon nanotubes and individual molecules, even though the respective data storage technologies are currently under development and yet to be commercialized.

In some embodiments, SoC 102 is implemented in a semiconductor package including one or more integrated circuits, and each integrate circuit integrates a subset of: one or more microprocessor or CPU cores, memory, input/output ports and secondary storage on a single substrate. PMIC 118 is also implemented in a semiconductor package including one or more integrated circuits each of which is formed on a single substrate. SoC 102 is configured to receive one or more internal supply voltages (also called rail voltages) provided by PMIC 118 via one or more power rails. In some embodiments, both SoC 102 and PMIC 118 are mounted on a main logic board, e.g., on two distinct areas of the main logic board, and electrically coupled to each other via conductive wires formed in the main logic board. This arrangement introduces parasitic effects and electrical noise that could compromise performance of the SoC, e.g., cause a voltage drop at an internal supply voltage. Alternatively, in accordance with various embodiments described below, semiconductor dies of SoC 102 and PMIC 118 are vertically packaged in an integrated semiconductor device, such that they are electrically coupled to each other via electrical connections that are not formed in the main logic board. Such vertical arrangement of the semiconductor dies of SoC 102 and PMIC 118 can reduce a length of electrical connections between SoC 102 and PMIC 118 and avoid performance degradation caused by routing the conductive wires on the main logic board.

It is noted that, in some embodiments, vertical arrangement of the semiconductor dies of SoC 102 and PMIC 118 is facilitated in part by integration of thin film inductors in a limited space between the dies of SoC 102 and PMIC 118. The thin film inductors are formed and integrated on a substrate of PMIC 118 and have an inductor height that is controlled to be less than the height of the limited space, such that the thin film inductors can fit into the limited space between the semiconductor dies of SoC 102 and PMIC 118. As the thin film inductors are formed on top of the substrate of PMIC 118, the thin film inductors can be directly connected to internal nodes or output nodes of PMIC 118, and no conductive wires of the main logic board are used to connect the thin film inductors to the internal or output nodes of PMIC 118.

In various embodiments of this application, a generic PMIC 118 is configured to drive different types of SoC 102 in different types of electronic devices 100. Regardless of whether PMIC 118 and SoC 102 are arranged side by side or vertically, PMIC 118 occupies the same footprint with respect to the main circuit board, while SoC 102 may have a distinct footprint based on the electronic modules integrated therein. PMIC 118 includes a plurality of voltage regulator units that are arranged in a field programmable array. The plurality of voltage regulator units are identical to each other, or includes more than one type of voltage regulator units. In a specific electronic device, control signals are determined based on rail voltages and rail currents of power rails required to power SOC 102 and other electronic modules, if any. For each of these power rails, a corresponding control signal is used to select a subset of voltage regulator units in the field programmable array of PMIC 118, and the selected voltage regulator units provide a rail current at a rail voltage to the respective power rail collectively. As such, PMIC 118 is reconfigured by these control signals to provide the rail voltages and currents to the power rails of SoC 102, and each voltage regulator unit in a plurality of configurable voltage regulators in PMIC 118 is either redundant or selected to drive one of the power rails by one of the control signals.

Figure 2:
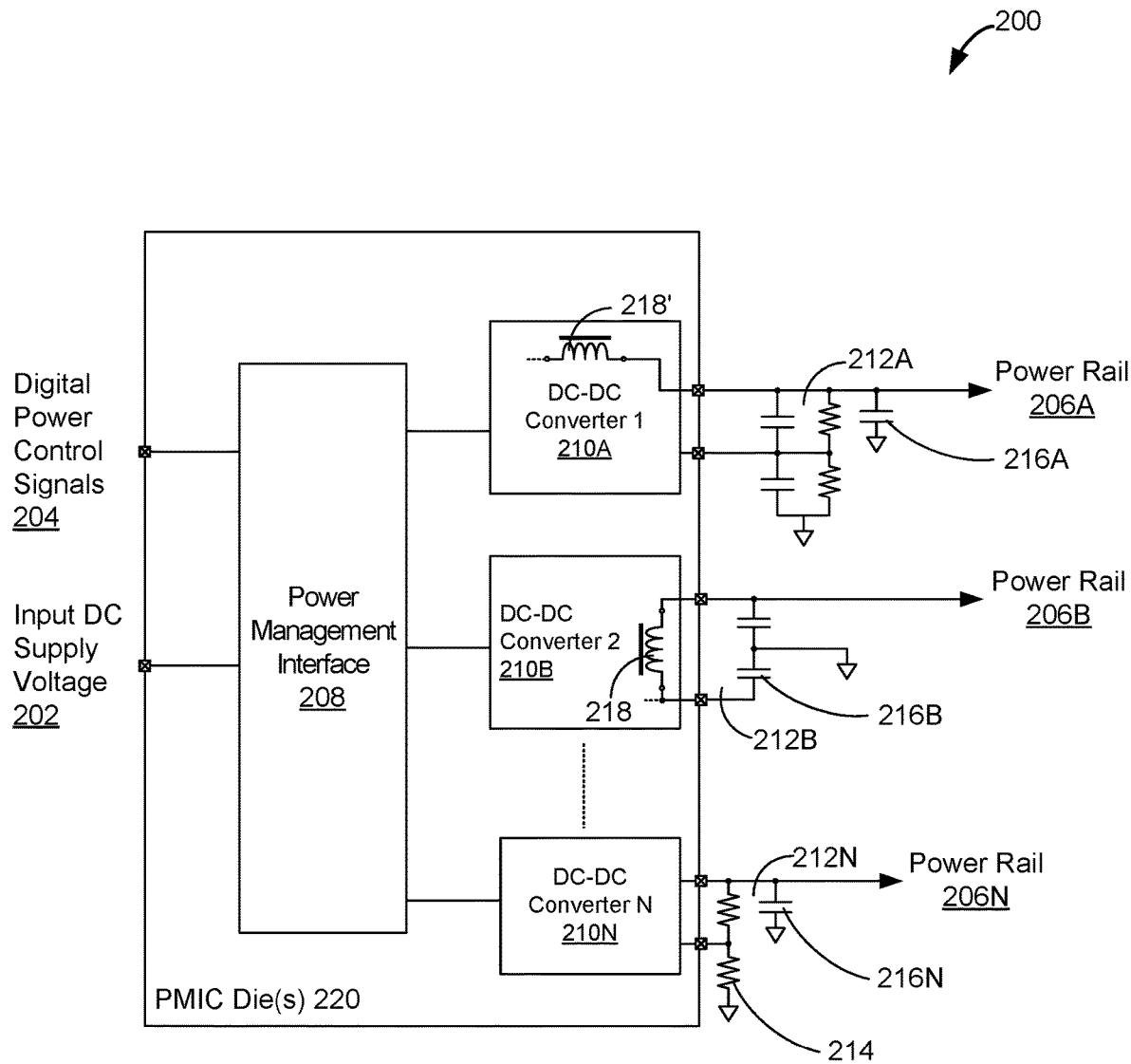
FIG. 2 is a block diagram of a power management system, in accordance with some embodiments.

FIG. 2 is a block diagram of a power management system 200 configured to provide power to one or more power rails 206 of an SoC, such as SoC 102, in accordance with some embodiments. Power management system 200 receives one or more input DC supply voltages 202 and digital power control signals 204, and converts the input DC supply voltage 202 to one or more rail voltages that are outputted by one or more power rails 206A, 206B to 206N and provided to SoC 102. Power management system 200 includes a power management interface 208, one or more DC-DC converters 210 (e.g., DC-DC converters 210A, 210B . . . 210N), and one or more output filters 212 (e.g., output filters 212A, 212B, . . . 212N). Power management interface 208 receives the input DC supply voltage(s) 202 and digital power control signals 204. In some embodiments, power management interface 208 is controlled by a master power management interface of a central processor unit (e.g., on SoC 102) and configured to receive digital power control signals 204 from SoC 102. DC-DC converters 210 are coupled to power management interface 208 and power rails 206, and are controlled by the digital power control signals 204 to generate the one or more rail voltages, which are provided on power rails 206, from the input DC supply voltage(s) 202. Output filters 212 are coupled to DC-DC converters 210 and configured to reduce noise in and maintain stability of power rails 206 provided to SoC 102. In some embodiments, an output filter (e.g., any of 212A, 212B, . . . 212N) includes one or more respective output resistors 214 and one or more output capacitors 216 (e.g., 216A, 216B, . . . 216N). In some embodiments, an output filter (e.g., 212B) includes an inductor 218 and one or more output capacitors (e.g., capacitor 216B).

In some embodiments, power management system 200 is implemented on one or more PMIC dies 220 (corresponding to PMIC 118 of FIG. 1), and each PMIC die has a single substrate. In some embodiments, power management interface 208 and DC-DC converters 210 are formed on a substrate of a single PMIC die 220, e.g., belong to the same integrated circuit fabricated on the substrate of PMIC die 220. Conversely, in some embodiments, power management interface 208 and DC-DC converters 210 are formed on a plurality of substrates of a plurality of PMIC dies 220. In some embodiments, in addition to power management interface 208 and DC-DC converters 210, each PMIC die 220 further includes a plurality of thin film inductors that are fabricated or mounted on a top surface of the substrate of PMIC die 220. Optionally, the plurality of thin film inductors include one or more inductors 218 used in output filters 212. Optionally, the plurality of thin film inductors includes one or more inductors 218' used in DC-DC converters 210. In some embodiments, in addition to interface 208, converters 210 and inductors 218/218', PMIC die 220 further integrates a subset of output resistors 214 and capacitors 216 of output filters 212.

In some embodiments, the power management system 200 includes a field programmable array of voltage regulator units, output filters 212, one or more output resistors 214, one or more output capacitors 216, and one or more inductors 218. Digital power control signals 204 are determined, e.g., by SoC 102, based on target power capabilities (e.g., rail voltages and rail currents) required for the power rails 206. For example, each power rail is configured to power a CPU cluster, a cache, or a functional block of SoC 102, which has a respective power demand that is used by SoC 102 to set forth a target power capacity of the respective power rail. In accordance with control signals 204, voltage regulator units in the field programmable array are partitioned and configured to form one or more DC-DC converters 210, e.g., DC-DC converters 210A, 210B, . . . 210N, to drive the power rails 206 with the target power capabilities. For each DC-DC converter 210, additional components 212-218 can also be selected and controlled by a respective subset of control signals 204 to enable desirable noise performance for the corresponding power rail 206.

Figure 3:
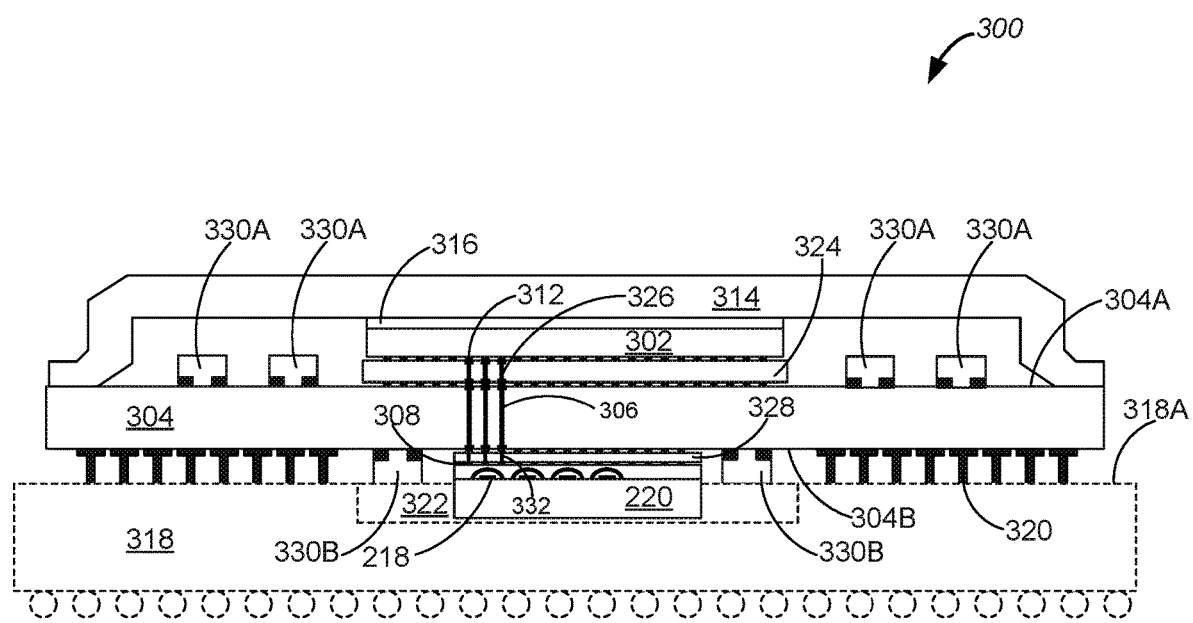
FIG. 3 is a cross sectional view of an integrated semiconductor device, in accordance with some embodiments.

FIG. 3 is a cross sectional view of an integrated semiconductor device 300, in accordance with some embodiments. Semiconductor device 300 integrates at least one SoC die 302 and at least one PMIC die 220 in a semiconductor package, and includes at least a package substrate 304 having a first surface 304A and a second surface 304B that is opposite to first surface 304A. SoC die 302 is disposed on first surface 304A of package substrate 304, and PMIC die 220 is mechanically coupled to second surface 304B of package substrate 304.

Package substrate 304 further includes a plurality of first via interconnects 306 that pass through a body of package substrate 304 and is exposed on both first and second surfaces 304A and 304B. PMIC die 220 is electrically coupled to SoC die 302 via the plurality of first via interconnects 306 of package substrate 304. Specifically, PMIC die 220 includes a plurality of DC connections 308 configured to output a plurality of rail voltages, provided to power rails 206 (FIG. 2). When PMIC die 220 is mounted on second surface 304B of package substrate 304, DC connections 308 are electrically coupled to the plurality of first via interconnects 306 of package substrate 304. In some embodiments, SoC die 302 includes a plurality of power connections 312 configured to receive the plurality of rail voltages. When SoC die 302 is mounted on first surface 304A of package substrate 304, power connections 312 are electrically coupled to the plurality of first via interconnects 306 of package substrate 304. As such, PMIC die 220 is configured to provide DC power (i.e., rail voltages and rail current of power rails 206) to SoC die 302 via DC connections 308 of PMIC die 220, power connections 312 of SoC die 302, and first via interconnects 306 of package substrate 304. Further, by using very low impedance DC connections 308, the quality of the DC power provided PMIC die 220 to SoC die 302 is substantially improved relative to systems in which PMIC die 220 and SoC die 302 are separately packaged and positioned side by side on a main circuit board.

In some embodiments, power management interface 208 on PMIC die 220 is controlled by a master power management interface of SoC die 302, and configured to receive digital power control signals 204 from SoC die 302. A subset of first via interconnects 306 is configured to transfer digital power control signals 204 from SoC die 302 to PMIC die 220.

SoC die 302 has a first footprint on package substrate 304, and PMIC 220 has a second footprint on package substrate 304. The first and second footprints at least partially overlap for the purposes of coupling DC connections 308 of PMIC die 220 and power connections 312 of SoC die 302 directly using the plurality of first via interconnects 306. In some situations, the first footprint of SoC die 302 is larger than and entirely encloses the second footprint of PMIC die 220. Alternatively, in some situations, the first footprint of SoC die 302 is offset from the second footprint of PMIC die 220, but at least partially overlaps the second footprint of PMIC die 220. DC connections 308 of PMIC die 220, power connections 312 of SoC die 302, and first via interconnects 306 of package substrate 304 are aligned and enclosed in an overlapped area of the first and second footprints.

Additionally, PMIC die 220 includes a plurality of thin film inductors 218 corresponding to the plurality of DC connections 308. The plurality of thin film inductors 218 is located adjacent to or facing second surface 304B of package substrate 304, e.g., on a top surface of PMIC die 220 facing second surface 304B of package substrate 304. Stated another way, the plurality of thin film inductors 218 is disposed between the top surface of PMIC die 220 and second surface 304B of package substrate 304. In some embodiments, PMIC die 220 is mechanically coupled to package substrate 304, e.g., via an adhesive. A height of the plurality of thin film inductors 218 is less than a predetermined threshold height (e.g., 1 mm, 100 µm) to maintain robustness of mechanical coupling between PMIC die 220 and package substrate 304.

In some embodiments, integrated semiconductor device 300 further includes a cover 314 coupled to first surface 304A of package substrate 304. Cover 314 is configured to conceal SoC die 302 and at least part of first surface 304A of package substrate 304, thereby protecting SoC die 302 and at least part of first surface 304A. Further, in some embodiments, cover 314 is made of an electrically conductive material and configured to be grounded to provide electrostatic shielding for SoC die 302 and any other circuit on first surface 304A, if completely concealed by cover 314, or the part of first surface 304A concealed by cover 314, if first surface 304A is only partially concealed by cover 314. In some situations, cover 314 is made of a thermally conductive material configured to dissipate heat generated by SoC die 302. In some embodiments, a thermal spreader 316, or layer of thermal spreader, is used to couple SoC die 302 to an interior surface of cover 314 to spread the heat generated by SoC die 302 evenly from SoC die 302 to cover 314.

In some embodiments, semiconductor device 300 further includes a socket substrate 318. Socket substrate 318 has a third surface 318A facing second surface 304B of package substrate 304. Package substrate 304 is electrically coupled to socket substrate 318 via a plurality of electrical connectors 320. Specifically, second surface 304B of package substrate 304 includes a first area (e.g., a central area) to which PMIC die 220 is mechanically coupled and a second area (e.g., a peripheral area) where the plurality of electrical connectors 320 are located. In an example, the second area is adjacent to and surrounds the first area. It is noted that under some circumstances, semiconductor device 300 is provided with socket substrate 318. However, under some circumstances, socket substrate 318 is fixed on a circuit board of the electronic device in FIG. 1, and is not part of integrated semiconductor device 300. Rather, semiconductor device 300 is a replaceable part that is provided to offer functions of a combination of PMIC die 220 and SoC die 302.

In some embodiments, third surface 318A of socket substrate 318 is substantially flat, and PMIC die 220 is disposed between second surface 304B of package substrate 304 and third surface 318A of socket substrate 318. A height of the plurality of thin film inductors 218 is less than a predetermined threshold height (e.g., 1 mm, 100 μm) that is determined by a difference between a length of electrical connectors 320 and a thickness of PMIC die 220. Alternatively, in some embodiments, socket substrate 318 includes a recessed portion 322 that is formed on third surface 318A and configured to receive PMIC die 220 when PMIC die 220 is mechanically and electrically coupled to second surface 304B of package substrate 304. A depth of recessed portion 322 is less than a thickness of socket substrate 318. In some situations, PMIC die 220 is suspended in recessed portion 322, i.e., separated from a bottom surface of recessed portion 322 by an air gap. Alternatively, in some situations, PMIC die 220 comes into contact with the bottom surface of recessed portion 322 directly or via an intermediate layer (e.g., an adhesive layer, a thermal spreader layer, or a layer that is both adhesive and a thermal spreader).

In some embodiments not shown in FIG. 3, the depth of recessed portion 322 is equal to the thickness of socket substrate 318, and recessed portion 322 is an opening or cutoff on socket substrate 318. When socket substrate 318 is mounted on a circuit board (e.g., a main logic board), PMIC die 220 is suspended in recessed portion 322 (also called opening or cutoff), and at least partially surrounded by package substrate 304, socket substrate 318, and the circuit board.

In some embodiments, power connections 312 of SoC die 302 are not coupled to first via interconnects 306 of package substrate 304 directly. Rather, a first interposer 324 is disposed between SoC die 302 and first surface 304A of package substrate 304. First interposer 324 further includes a plurality of second via interconnects 326 configured to at least electrically couple power connections 312 of SoC die 302 and first via interconnects 306 of package substrate 304. Likewise, in some embodiments, DC connections 308 of PMIC die 220 are not coupled to first via interconnects 306 of package substrate 304 directly. Rather, a second interposer 328 is disposed between PMIC die 220 and second surface 304B of package substrate 304. Second interposer 328 further includes a plurality of third via interconnects configured to at least electrically couple DC connections 308 of PMIC die 220 and first via interconnects 306 of package substrate 304. As such, a power rail 206 of SoC 102 includes at least power connection 312 of SoC die 302, first via interconnect 306 of package substrate 304, and DC connection 308 of PMIC die 220, and in some situations, further includes second via interconnect 326 of first interposer 324 and/or a third via interconnect 332 of second interposer 328.

In some embodiments, semiconductor device 300 further includes one or more discrete electronic modules 330 (e.g., resistor, capacitor, inductor, transistors, and logic chip). Discrete electronic modules 330 may be electrically coupled in an input/output interface circuit of SoC die 302 to control input/output coupling for SoC die 302. Optionally, a subset of discrete electronic modules 330 (e.g., components 330A) is disposed on first surface 304A of package substrate 304. Each component 330A may be contained within cover 314 or located outside cover 314. Optionally, a subset of discrete electronic modules 330 (e.g., components 330B) is mechanically coupled to second surface 304B of package substrate 304. If a respective component 330B has a low profile (e.g., thinner than a length of electrical connectors 320), component 330B may fit into a gap between second surface 304B of package substrate 304 and third surface 318A of socket substrate 318. Otherwise, if component 330B does not have a low profile (e.g., thicker than the length of electrical connectors 320), a respective component 330B can be received by recessed portion 322 of socket substrate 318 and disposed adjacent to PMIC die 220.

SoC die 302 and PMIC die 220 are vertically arranged in semiconductor device 300. Power connections 312 of SoC die 302 and DC connections 308 of PMIC die 220 are aligned and positioned in proximity to each other, thereby reducing parasitic resistance and capacitance coupled to each power rail 206 that provides a rail voltage to SoC die 302. It is noted that in some implementations, a plurality of PMIC dies 220 can be disposed in recessed portion 322 of socket substrate 318 and electrically coupled to one or more SoC dies 302 disposed on first surface 304A of package substrate 304. For example, two PMIC die 220 are disposed in recessed portion 322 of socket substrate 318 to power four SoC dies 302 collectively. One of SoC dies 302 optionally corresponds to a microprocessor or CPU core or a cluster of microprocessor or CPU cores.

Additionally, in some embodiments of this application, PMIC die 220 includes a field programmable array of voltage regulators that is configurable by control signals to drive different types of SoC dies 302. In some situations, the same PMIC die 220, package substrate 304, and socket substrate 318 are used to support the different types of SoC dies 302. Recessed portion 322 formed on socket substrate 318 has a fixed size to accommodate the same PMIC die 220, and first via interconnects 306 that pass through the body of package substrate 304 have fixed locations. Alternatively, in some situations, while footprint sizes of package substrate 304 and socket substrate 318 are varied for the different types of SoC dies, the same PMIC die 220 allows recessed portion 322 and first via interconnects 306 of package substrate 304 to remain unchanged, thereby avoiding custom designing PMIC die 220 and the entire package for each individual type of SoC die 302. As such, application of the field programmable array of voltage regulators in PMIC die 220 simplifies an assembly process and enhances cost efficiency of the semiconductor device 300.

Figure 4A:
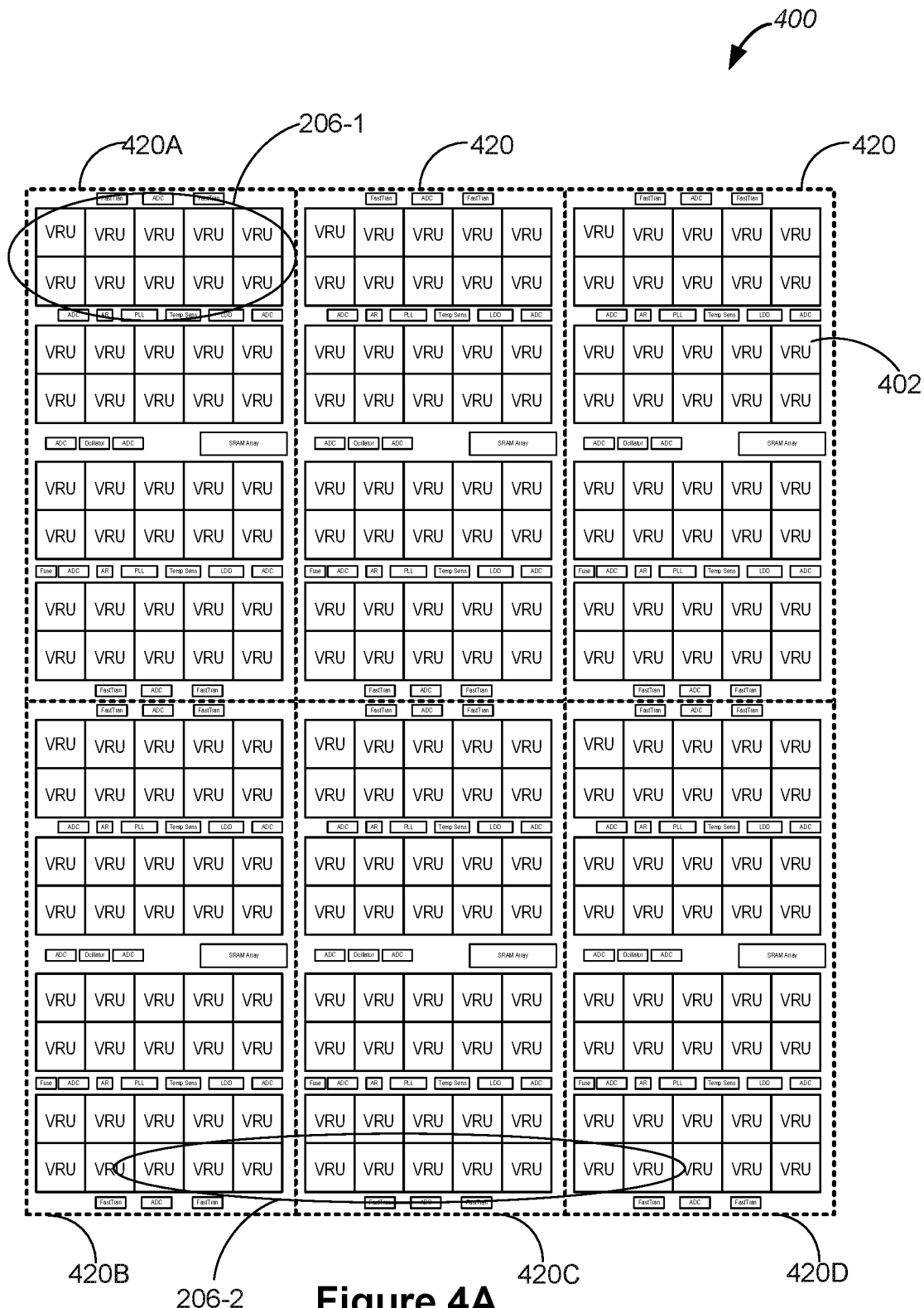
FIG. 4A is a field programmable array of voltage regulators in accordance with some embodiments.
Figure 4B:
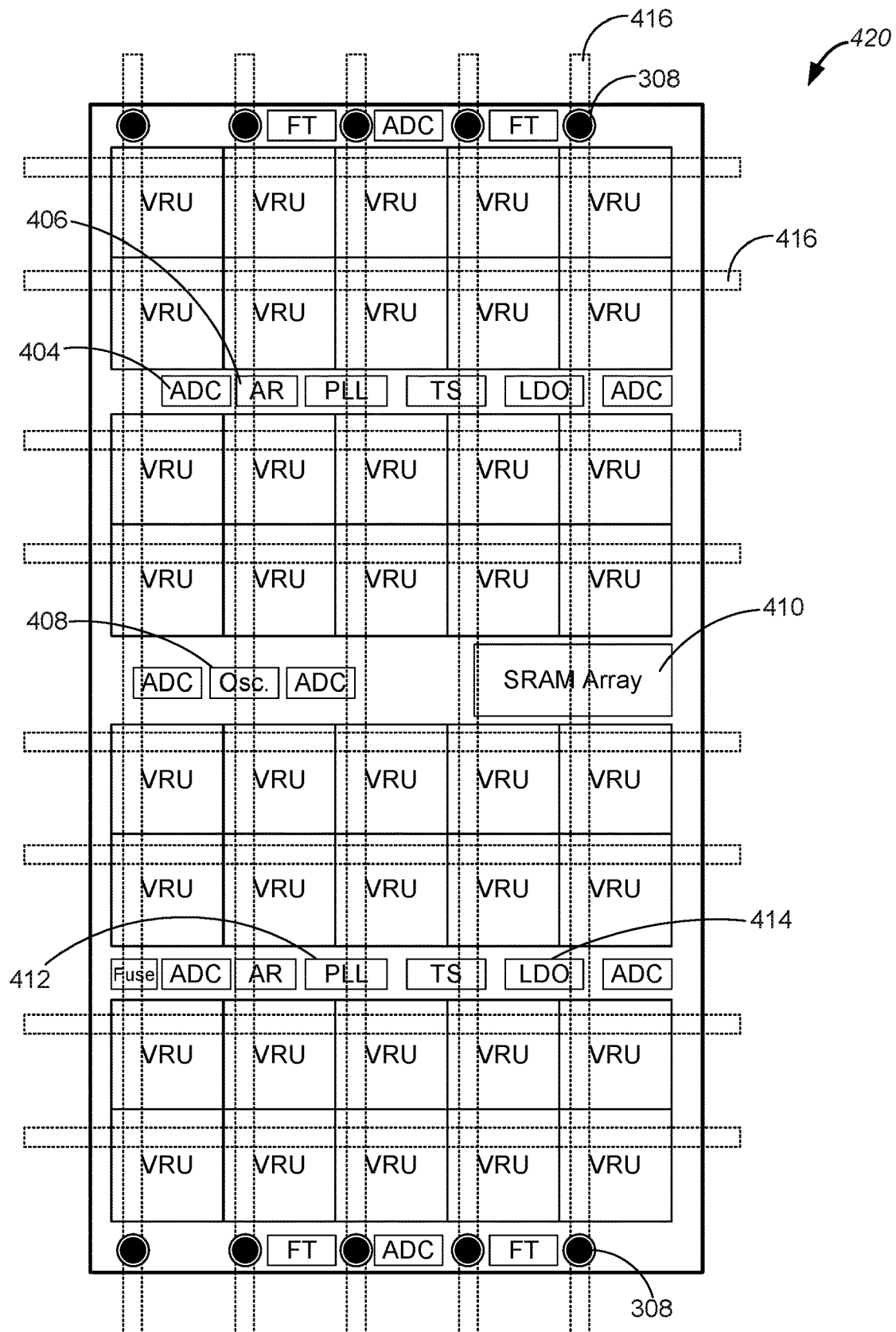
FIG. 4B is a basic cluster of voltage regulators in the field programmable array shown in FIG. 4A, in accordance with some embodiments.

FIG. 4A is a field programmable array 400 of voltage regulators 402 in accordance with some embodiments, and FIG. 4B is a basic cluster 420 of voltage regulators 402 in the field programmable array 400 shown in FIG. 4A, in accordance with some embodiments. Field programmable array 400 of voltage regulator 402 is used to establish power management system 200, and configured to provide one or more power rails 206 to a SoC, such as SoC 102. In field programmable array 400, voltage regulators 402 correspond to one or more voltage regulator types, and are organized in a plurality of rows and a plurality of columns (e.g., 16 rows and 15 columns in FIG. 4A). When only one type of voltage regulator is used, voltage regulators 402 of field programmable array 400 are identical to each other (e.g., have identical circuitry, but can be differently configured). In some implementations, field programmable array 400 includes a single cluster 420 of voltage regulators. In some implementations, field programmable array 400 includes a plurality of basic clusters 420 of voltage regulators, e.g., 6 basic clusters 420 arranged in 2 rows and 3 columns in FIG. 4A. The plurality of basic clusters 420 in field programmable array 400 may be identical to each other. Alternatively, the plurality of basic cluster 420 may be independent from each other, and each basic cluster 420 includes a respective sub-array of voltage regulators 402 that includes a single type of voltage regulators or two or more types of voltage regulators. In some implementations, each basic cluster 420 is formed on a distinct substrate and includes a standalone semiconductor chip. Alternatively, in some implementations, two or more basic clusters 420 are formed on the same substrate. Regardless of whether basic clusters 420 of field programmable array 400 are formed on a single substrate or more than one substrate, these basic clusters 420 are coupled to each other and configured to implement power management system 200 jointly.

Figure 5:
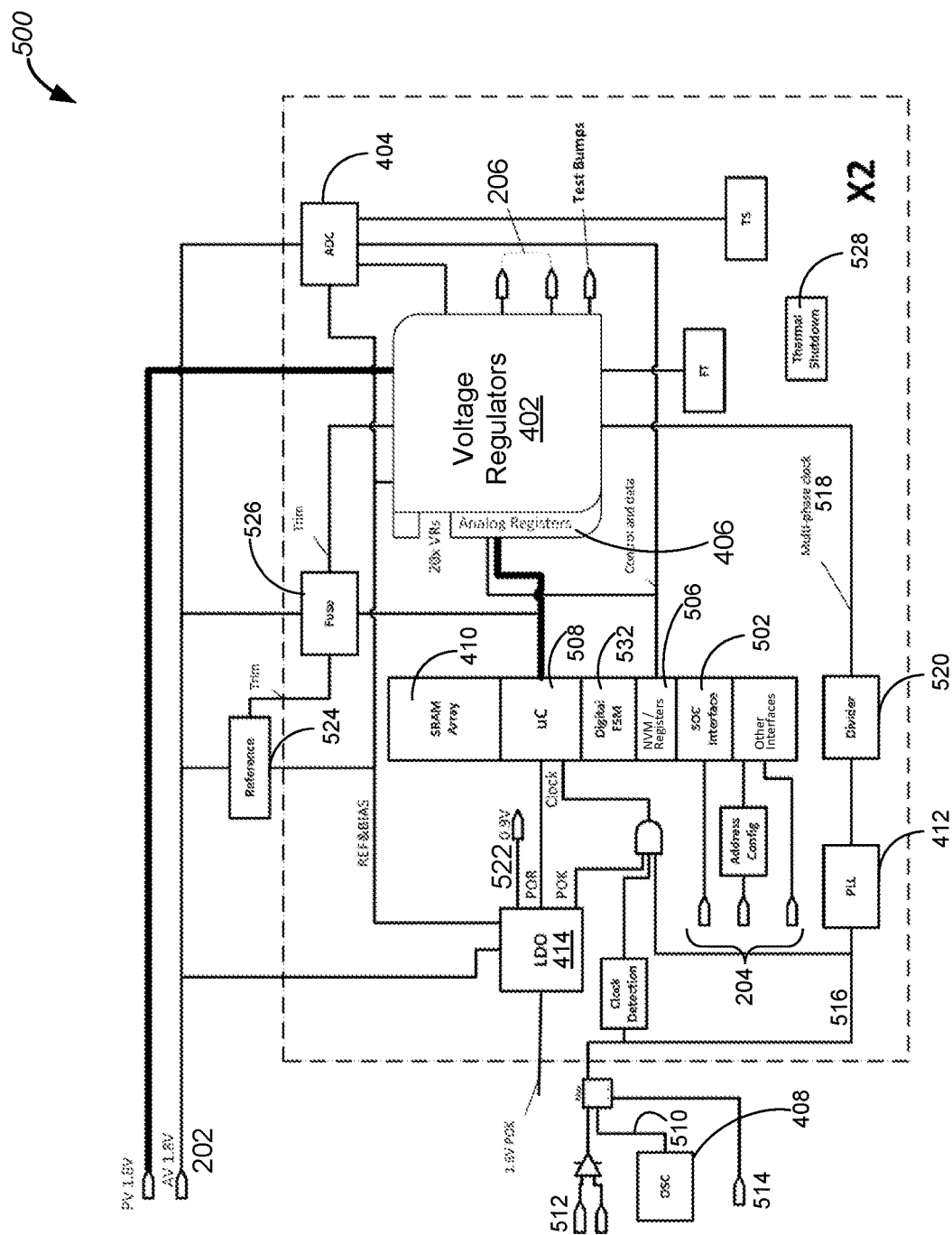
FIG. 5 is a schematic diagram of a power management system including a field programmable array of voltage regulators shown in FIG. 4, in accordance with some embodiments.
Figure 6:
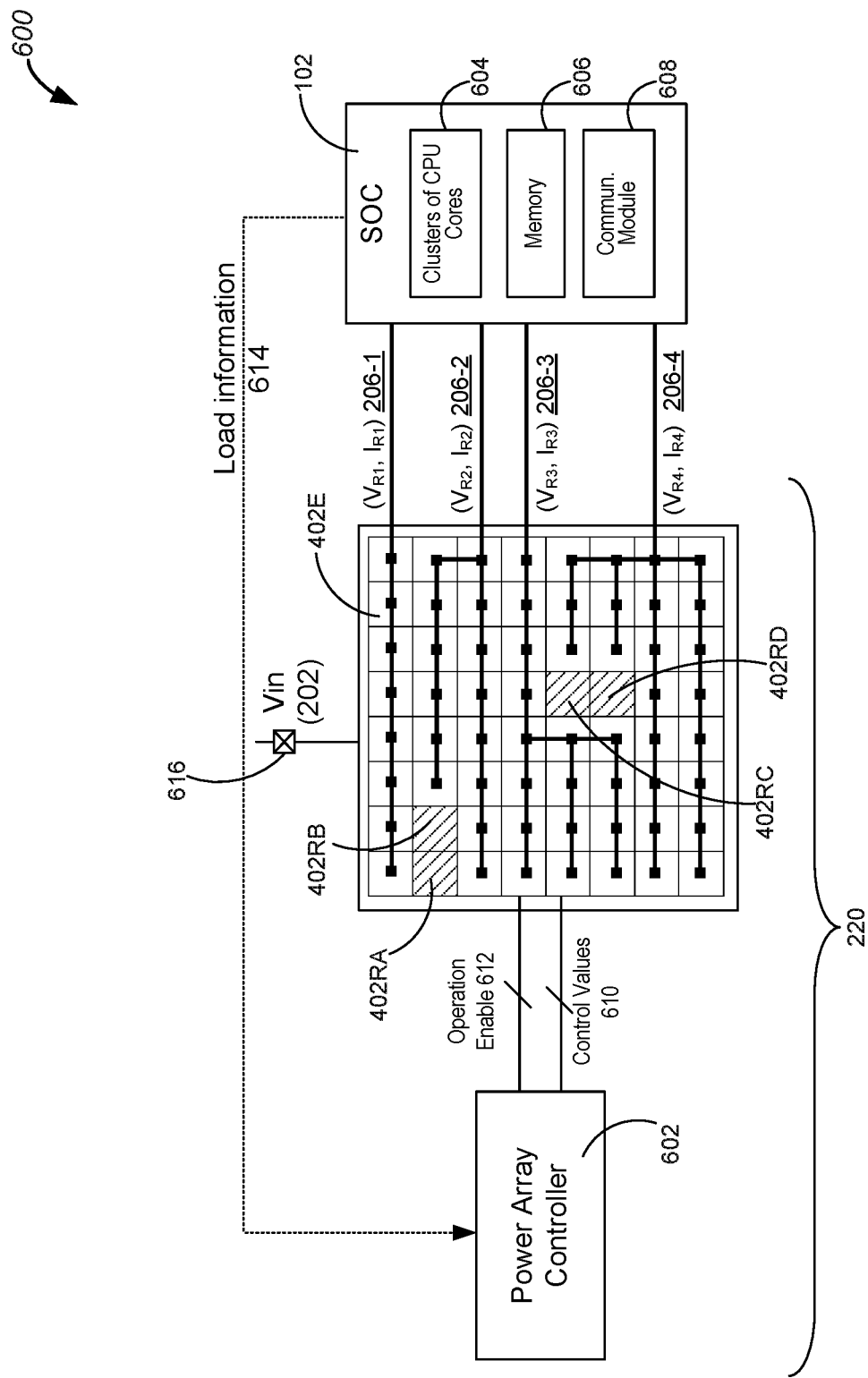
FIG. 6 is a simplified block diagram of an integrated semiconductor device including a plurality of voltage regulators for providing one or more power rails to an SoC, in accordance with some embodiments.

In some implementations, as shown in FIG. 2, power management system 200 includes power management interface 208 having a power array controller (e.g., power array controller 602 in FIG. 6). The power array controller is coupled to, and configured to control, field programmable array 400 of voltage regulators. In some embodiments, the power array controller further includes a plurality of circuit modules, e.g., analog-to-digital converters (ADCs) 404, analog registers 406, oscillators 408, static random-access memory (SRAM) arrays 410, phase-locked loop (PLL) circuits 412, and/or low-dropout regulators (LDOs) 414. The power array controller 602 optionally includes one or more of: one or more processors (e.g., microcontroller 508, FIG. 5), non-volatile memory (NVM) 506 (e.g., read-only memory, one-time-programmable (OTP) memory), registers 506, and finite state machines (e.g., 532). In some implementations, each circuit module in the plurality of circuit modules is disposed between two adjacent rows of voltage regulators 402 in field programmable array 400. In some implementations, memory of the power array controller stores one or more programs having instructions, which when executed by the one or more processors cause the processors to control voltage regulators 402 in field programmable array 400 to output power.

The plurality of voltage regulators 402 are controlled by the power array controller of power management interface 208 to output power to a plurality of power rails 206. Each power rail 206 is required to provide a respective rail current $I_R$ at a respective rail voltage $V_R$. The power array controller is configured to select, for a respective power rail, a respective subset of voltage regulators 402 in field programmable array 400 according to at least the respective rail current $I_R$ of the respective power rail. In some embodiments, for each power rail 206, selection of voltage regulators 402 is implemented in a package or board level of power management system 200, and may include voltage regulators 402 in different clusters 420 that are distributed over the entire field programmable array 400. The voltage regulators selected for a respective power rail 206 need not be limited to voltage regulators within a single cluster 420, or a limited number of clusters 420. In an example, a first power rail 206-1 is configured to be powered by ten voltage regulators 402 that are located on the same cluster 420A. In another example, a second power rail 206-2 is configured to be powered by ten voltage regulators 402 that are located in two or more distinct clusters (e.g., 420B, 420C and 420D) that are formed on two or more distinct semiconductor chips.

For each of the plurality of power rails 206 (e.g., power rail 206-1 or 206-2), voltage regulators 402 in the respective subset of voltage regulators 402 selected for that power rail are controlled to share a corresponding load at the respective power rail in a substantially even manner. Each voltage regulator 402 in the respective subset, when activated to power the respective power rail, is controlled to provide the respective rail voltage $V_R$ and a substantially equal portion of the respective rail current $I_R$. For example, first power rail 206-1 provides a first rail voltage $V_{R1}$ and a first rail current $I_{R1}$, and each of ten voltage regulators 402 configured to power first power rail 206-1 has an output coupled to first power rail 206-1, and is configured to provide the first rail voltage $V_{R1}$ and one tenth of the first rail current (i.e., 0.1 $I_{R1}$). In some implementations, first power rail 206-1 is associated with one or more inter-regulator balancing circuits that are coupled among ten voltage regulators 402 to balance the load at the respective power rail evenly (or substantially evenly) among the ten voltage regulators 402. Conversely, in some implementations, no inter-regulator balancing circuit is coupled between any two of corresponding ten voltage regulators 402 configured to power first power rail 206-1. Each voltage regulator 402 is individually and independently controlled, e.g., based on a respective output current, to power a respective portion of the load that is balanced with other portions of the load that are powered by other voltage regulators 402.

One or more clusters 420 of voltage regulators are formed on the same substrate with one or more layers of interconnects 416. In some embodiments, pairs of adjacent layers of the one or more layers of interconnects 416 are electrically coupled via electrical contacts and/or vias. Each voltage regulator 402 of the one or more clusters 420 can be electrically coupled to a respective power rail 206 via interconnects 416. Each voltage regulator 402 can also be coupled to, and controlled by, the plurality of circuit modules of the power array controller via interconnects 416. In some implementations, a plurality of DC connections 308 are formed and exposed on a top surface of the substrate of the one or more clusters 420 of voltage regulators. The plurality of DC connections 308 are electrically coupled to a subset of interconnects 416 and are part of one or more power rails 206 of SoC die 302. DC connections 308 are configured to provide one or more rail voltages $V_R$ outputted by voltage regulators 402 to the one or more power rails 206. Specifically, referring to FIGS. 3 and 4B, clusters 420 of voltage regulators in PMIC die 220 are configured to provide DC power (i.e., the rail voltages $V_R$ and currents $I_R$ outputted by voltage regulators 402) to SoC die 302 via DC connections 308 of PMIC die 220, power connections 312 of SoC die 302, and first via interconnects 306 of package substrate 304. In an example, each DC connection 308 of PMIC die 220 includes a conductive bump (e.g., a solder, gold or copper bump).

Field programmable array 400 of voltage regulators is scalable with power requirements (e.g., rail voltage $V_R$, rail current $I_R$) of different types of SoCs 302. For example, field programmable array 400 includes a plurality of voltage regulators 402 organized in cluster. A first group of voltage regulators 402 are activated to power a first plurality of power rails 206, when field programmable array 400 is configured to drive a first SoC 302. A second group of voltage regulators 402 are activated to power a second plurality of power rails 206, when field programmable array 400 is configured to drive a second SoC die 302. First SoC die 302 is distinct from second SoC die 302, and the first plurality of power rails 206 are distinct from the second plurality of power rails 206. The first and second groups of voltage regulators 402 are determined based on the power requirements of power rails 206 of first SoC die 302 and second SoC die 302, respectively. The first and second groups of voltage regulators 402 are distinct from each other, while the same field programmable array 400 is applied to drive first SoC die 302 and second SoC die 302. As such, field programmable array 400 is scaled with the power requirements of power rails 206 of first SoC die 302 and second SoC die 302.

FIG. 5 is a schematic diagram of a power management system 500 including a field programmable array 400 of voltage regulators 402 shown in FIG. 4, in accordance with some embodiments. Field programmable array 400 includes a plurality of voltage regulators 402 configured to be controlled by a plurality of circuit modules. In some implementations, the plurality of circuit modules are disposed between rows of the plurality of voltage regulators 402 on field programmable array 400. These circuit modules belong to a power management interface 208. In some implementations, power management system 500 is controlled by a master power management interface of a central processor unit (e.g., SoC 102) and configured to receive one or more power control signals 204 from SoC 102 via an SoC interface 502. Power control signals 204 include information (e.g., configuration information, such as voltage and current requirements) for a plurality of power rails 206 of corresponding SoC 102, e.g., rail voltages $V_R$ and rail currents $I_R$ of power rails 206. SoC 102 stores the information for power rails 206 in registers 506. The information for power rails 206 is subsequently extracted from registers 506, and a microcontroller 508 is configured to select a subset of voltage regulators 402 in the plurality of voltage regulators 402 to drive each power rail 206 of corresponding SoC die 302 based on the information for power rails 206 in registers 506.

Power management system 500 further includes one or more of: an ADC 404, analog registers 406, an oscillator 408, an SRAM array 410, a PLL circuit 412, and an LDO 414. Oscillator 408 is configured generate an internal clock signal 510. A clock selection signal 514 is used to determine whether internal clock signal 510 or an external clock signal 512 is selected to act as a system clock 516. Microcontroller 508 is configured to operate under the control of system clock 516. PLL 412 is configured to receive system clock 516 and generate a multi-phase clock 518 with or without a divider 520. Each voltage regulator 402 includes one or more switching mode drive paths configured to operate at a frequency of multi-phase clock 518. The frequency of the one or more switching mode drive paths is equal to or is a factor of a frequency of system clock 516.

Additionally, in some embodiments, LDO 414 is applied to generate an additional rail voltage 522 from an input DC supply voltage 202; additional rail voltage 522 is distinct from rail voltages 206 provided by voltage regulators 402. Additional rail voltage 522 is substantially stable with line and load variations, immune to changes in ambient temperature, and stable over time. Variations in additional rail voltage 522 despite changes in the input DC supply voltage 202 (within a predefined range) is substantially small, e.g., less than a threshold dropout voltage. For example, input DC supply voltage 202 is equal to 1.8 V or below, and additional rail voltage 522 remains substantially stable at 0.9 V (e.g., having a variation less than ±50 mV) even when input DC supply voltage 202 drops to 1.1 V.

In some embodiments, power management system 500 further includes a reference generator 524 configured to provide one or more reference voltages to one or more of: LDO 414, voltage regulators 402, a fuse 526, and ADC 404. ADC 404 includes track and hold circuitry and an analog input multiplexer that allows conversion of up to nine different inputs (e.g., one or more reference voltages, input DC supply voltage 202, rail voltages 206, control and data extracted from registers 506).

In some embodiments, power management system 500 further includes a thermal shutdown module 528 configured to monitor a temperature of SoC die 302 coupled to power management system 500 or a temperature of power management system 500 itself and control (e.g., disable) outputting of rail voltages on power rails 206 based on the temperature of SoC die 302 or power management system 500. In an example, when the temperature of SoC die 302 exceeds a predefined SoC threshold temperature (e.g., 85° C.), thermal shutdown module 526 controls power management system 500 to disable outputting of rail voltages $V_R$ on power rails 206, allowing the temperature of SoC die 302 to drop below the SoC threshold temperature.

FIG. 6 is a simplified block diagram of an integrated semiconductor device 600 including a plurality of voltage regulators 402 for providing one or more power rails 206 to an SoC 102, in accordance with some embodiments. The plurality of voltage regulators 402 is arranged in a field programmable array 400. A power array controller 602 includes a plurality of electronic modules (e.g., one or more of SoC interface 502, oscillator 408, microcontroller 508, LDO 414, and reference generator 524 in FIG. 5), and is coupled to the plurality of voltage regulators 402. Power array controller 602 is configured to control the plurality of voltage regulators 402 to output power to a plurality of power rails 206. Each power rail 206 provides a respective rail current $I_R$ at a respective rail voltage $V_R$. Referring to FIG. 6, field programmable array 400 of voltage regulators 402 powers four power rails 206-1, 206-2, 206-3, and 206-4, and provides rail currents $I_{R1}$, $I_{R2}$, $I_{R3}$, and $I_{R4}$ at rail voltages $V_{R1}$, $V_{R2}$, $V_{R3}$, and $V_{R4}$, respectively. For each of the plurality of power rails 206, power array controller 602 determines the respective rail current $I_R$ associated with the respective power rail 206, selects a subset of voltage regulators 402 according to at least the respective rail current $I_R$, and enables the subset of voltage regulators 402 to generate the respective rail voltage $V_R$ and provide the respective rail current $I_R$ collectively. As such, power array controller 602 and voltage regulators 502 implements a power management system for SOC 102 on one or more PMIC dies 220 (corresponding to PMIC 118 of FIG. 1).

SoC 102 includes a plurality of electronic components, e.g., one or more microprocessor or CPU cores 604, memory 606, communication modules 608, timing sources, peripherals (e.g., clocks, counter timers), analog interfaces, input/output ports, and/or secondary storage. The microprocessor or CPU cores 604 are optionally arranged in clusters. SoC 102 is implemented by one or more integrated circuits (e.g., SoC dies 302) disposed on the same package substrate 304. Each SoC die 302 integrates a subset of the electronic modules of SoC 102 on a respective semiconductor substrate. In an example, SoC 102 has a main SoC die including one or more processor cores 604 and a companion SoC die including memory 606, analog interfaces, or other components distinct from the processor cores 604.

For each power rail 206, the respective rail voltage $V_R$ is determined by operation of the respective subset of the electronic components of SOC 102. Power array controller 602 is configured to determine a control value 610 based on at least the respective rail voltage $V_R$, and to provide the determined control value 610 to the subset of voltage regulators 402 corresponding to the respective power rail 206, thereby enabling the subset of voltage regulators 402 to generate the respective rail voltage $V_R$ and provide the respective rail current $I_R$ collectively. Further, in some embodiments, power array controller 602 provides an operation enable signal 612 to the selected subset of voltage regulators corresponding to each power rail 206 to generate the respective rail voltage $V_R$ and provide the respective rail current $I_R$ collectively.

In some embodiments, power array controller 602 includes one or more processors and memory having instructions stored thereon, which when executed by the one or more processors cause the processors to control voltage regulators 402 to output power to the plurality of rails 206. VRU grouping configurations are optionally stored in the memory (e.g., in non-volatile memory 506, FIG. 5) of power array controller 602, an off-chip non-volatile memory (NVM) of system module 100, or a basic input/output system (BIOS) of system module 100 to associate control value 610 and enable signal 612 with the subset of voltage regulators for each of power rails 206. In some situations, the VRU grouping configurations are loaded and implemented by power array controller 602 when PMIC 220 is being powered up.

Each of the plurality of power rails 206 is configured to power a subset of the electronic modules of SOC 102, which becomes a load to the respective power rail 206. For each power rail 206, power array controller 602 is configured to determine load information 614 corresponding to an anticipated or actual load on the respective power rail 206, and determine the respective rail current $I_R$ associated with the respective power rail in accordance with load information 614. In some embodiments, a power rail 206 is coupled to the main SoC die having one or more processor cores 604 arranged in clusters, and the load information 614 of this power rail 206 corresponds to processor load information for one or more clusters of processors 604 of the main SoC die coupled to this power rail 206. Examples of the processor load information include a total number of operations the types of operations to be performed by the one or more clusters of processors 604. Conversely, in some embodiments, one of the power rails 206 is coupled to the companion SoC die having memory 606, and is configured to power write and read operations on memory 606. The load information for that power rail 206 corresponds to memory load information for memory accesses of memory 606 on the companion SoC die. Examples of the memory load information include a memory type, a frequency of memory write operations, and a frequency of memory read operations of memory 606. As such, the rail current $I_R$ of each power rail 206 is adaptively determined based on the load information 614 (e.g., processor or memory load information) of the respective power rail 206.

Additionally, in some embodiments, each of the plurality of voltage regulators 402 in field programmable array 400 corresponds to a respective voltage regulator type selected from a plurality of predefined voltage regulator types. For each power rail 206, the selected subset of voltage regulators 402 corresponds to a respective voltage regulator type that is determined based on at least one performance criterion (e.g., one or more of a maximum rail current $I_{RLM}$, maximum regulator current $I_{RGM}$, output ripple voltage, power supply rejection ratio, load transient response, output noise, and power efficiency).

Referring to FIG. 6, after a respective subset of voltage regulators 402 is selected for each power rail 206, each voltage regulator 402 in the subset is uniquely associated with the respective power rail 206 at a certain time. For example, at a first time, power rails 206-1, 206-2, 206-3, and 206-4 are associated with four distinct sets of voltage regulators 402 as shown in FIG. 6. Each voltage regulator 402 in the first row is uniquely associated with power rail 206-1 at the first time, and cannot be associated with any of power rails 206-2, 206-3, and 206-4 at the same first time. However, at a second time distinct from the first time, voltage regulators 402 in field programmable array 400 may be reconfigured to power distinct power rails 206. Each voltage regulator 402 in the first row is uniquely associated with power rail 206-1 at the first time, but can be reconfigured to drive any of power rails 206-2, 206-3, and 206-4 at the second time. More generally, in some embodiments, at least a plurality of the voltage regulators 402 in the field programmable array 400 can be configured to provide, at any one time, power to a selected power rail 206 of a plurality of power rails. Thus, in some embodiments, a subset of the voltage regulators 402 are permanently assigned to certain power rails 206, while others are configurable as to which power rail 206 they are connected to. In some other embodiments, all of the voltage regulators 402 in the field programmable array 400 are configurable as to which power rail 206 they are connected to.

In some situations, one or more voltage regulators 402 (e.g., 402RA-402RD) in field programmable array 400 are redundant at a first time. That said, redundant voltage regulators 402RA-402RD are not coupled to any of power rails 206 at the first time. At a second time subsequent to the first time, each of these redundant voltage regulators 402RA-402RD can be reconfigured to provide power to a respective power rail 206. In some embodiments, a voltage regulator 402 is entirely powered down, when it is set as a redundant voltage regulator 402 not used to power any power rail 206. Conversely, in some embodiments, a voltage regulator 402 includes a bypass unit configured to provide a dummy load component. In a standby/redundancy mode, the bypass unit is enabled to bypass a feedback path from an output interface to an input of the voltage regulator 402 (e.g., under the control of operation enable signal 612), thereby disabling the respective voltage regulator 402 from contributing to any rail current $I_R$ via the output interface. More details on the standby/redundancy mode are provided below with reference to FIG. 13.

In some embodiments, the semiconductor device 600 further includes one or more direct current (DC) power supply interfaces 616. Each DC power supply interface 616 is configured to receive a distinct DC supply voltage $V_{IN}$ 202. Each voltage regulator 402 is coupled to a respective subset of the one or more DC power supply interfaces 616 and configured to be powered by a corresponding DC supply voltage $V_{IN}$ 202 and generate the respective rail voltage $V_R$ from the corresponding DC supply voltage $V_{IN}$ 202.

Figure 7A:
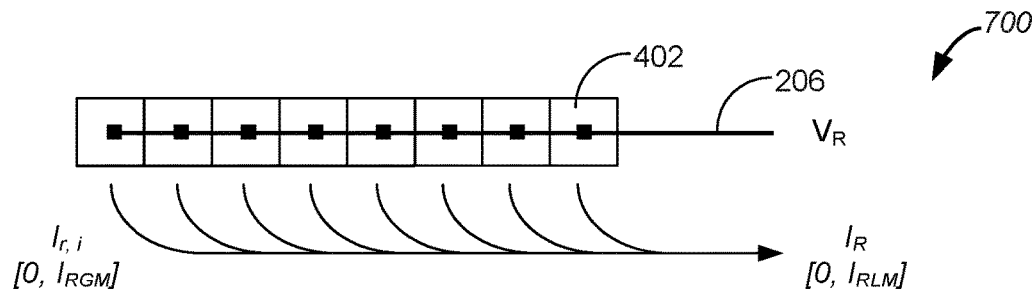
FIG. 7A illustrates a process of providing a rail current $I_R$ at a rail voltage $V_R$ using a subset of voltage regulators in accordance with some embodiments.
Figure 7B:
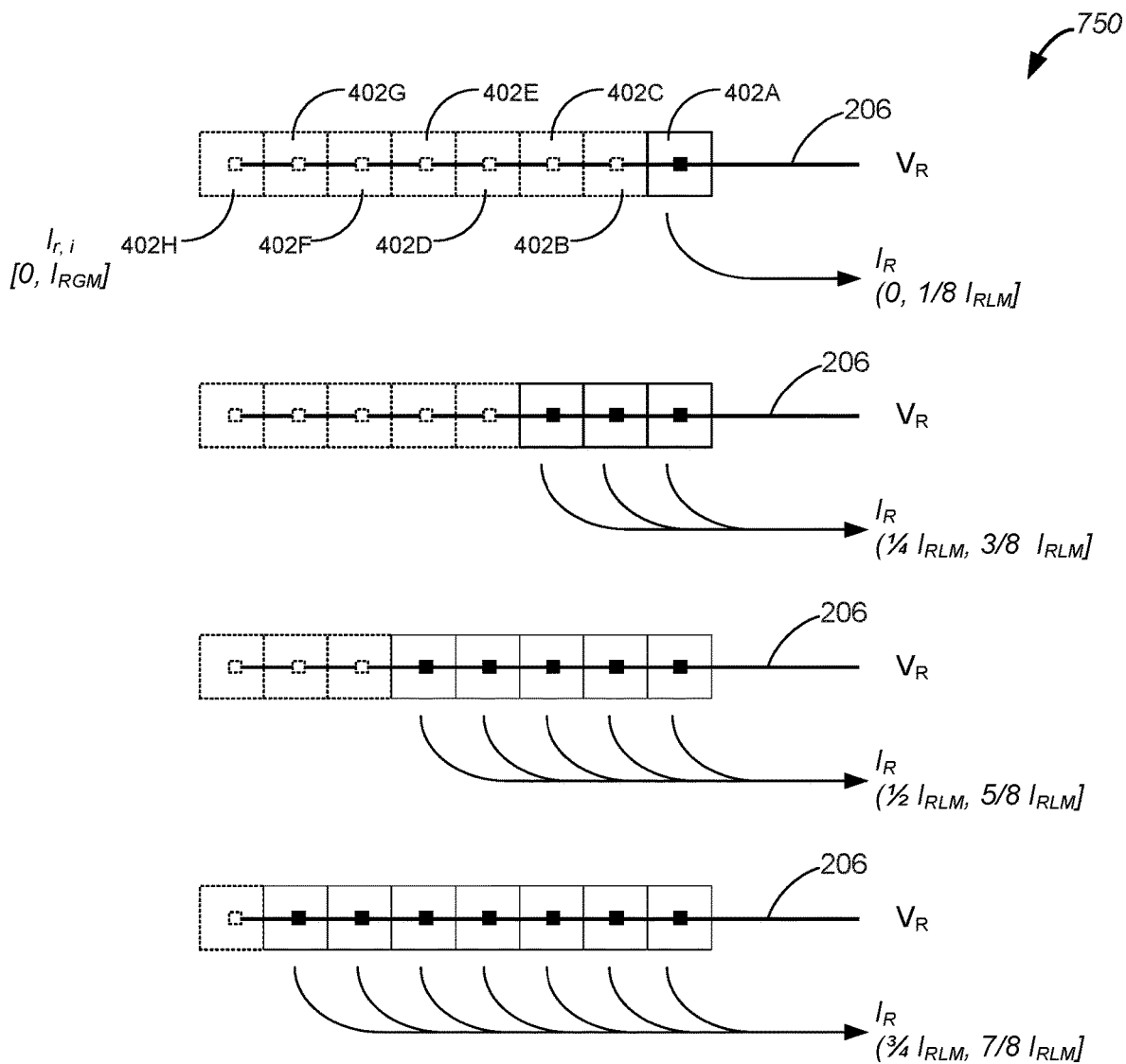
FIG. 7B illustrates processes of providing a rail current $I_R$ at a rail voltage $V_R$ based on one or more redundant voltage regulators, in accordance with some embodiments.

FIG. 7A illustrates a process 700 of providing a rail current $I_R$ at a rail voltage $V_R$ using a subset of voltage regulators 402 in accordance with some embodiments, and FIG. 7B illustrates processes 750 of providing a rail current $I_R$ at a rail voltage $V_R$ based on one or more redundant voltage regulators 402, in accordance with some embodiments. The rail current $I_R$ can vary between 0 and a maximum rail current $I_{RLM}$. Each of the subset of voltage regulators 402 is configured to provide a regulator current up to a maximum regulator current $I_{RGM}$. The subset of voltage regulators 402 has a first number of voltage regulators corresponding to a ratio of the maximum rail current $I_{RLM}$ and the maximum regulator current $I_{RGM}$. For example, in FIG. 6, the first power rail 206-1 is required to output the maximum rail current $I_{RLM}$, and each voltage regulator 402 can provide a respective regulator current up to the maximum regulator current $I_{RGM}$. In accordance with the maximum rail current $I_{RLM}$ (e.g., 0.6 A) and maximum regulator current $I_{RGM}$ (e.g., 80 mA), 8 voltage regulators are required to provide power rail 206-1 with the rail current $I_R$ up to the maximum rail current $I_{RIM}$.

In some embodiments, the maximum rail current $I_{RLM}$ is applied during a startup of power rail 206, so as to reach the rail voltage $V_R$ within a transient load response time, and the power rail 206 subsequently operates an operation current that is less than the maximum rail current $I_{RLM}$. Power rail 206 is configured to reach the rail voltage $V_R$ within the transient load response time at each startup of the power rail 206. Providing sufficient power to the power rail so as to reach rail voltage $V_R$ within the transient load response time is enabled by providing the maximum regulator current $I_{RGM}$ and maximum rail current $I_{RLM}$ during startup, and therefore, the first number of voltage regulators is determined in part based on the transient load response time required for the startup of the power rail 206. In some embodiments, however, when ramping up the voltage on a respective power rail 206 at startup of the power rail, the current provided by the power management system 500 is significantly less than the maximum rail current for that power rail, to reduce system stress, avoid overshoot, etc.

During operation (sometimes herein called normal operation, as opposed to startup) of the power rail 206, the operation current $I_R$ powering SoC 102 varies and does not exceed the maximum rail current $I_{RLM}$. Conversely, in some embodiments, the maximum rail current $I_{RLM}$ is reached, at least occasionally, during normal operation of the power rail 206, when the rail current $I_R$ is used to power operation of SoC 102. The operation current varies between 0 and the maximum rail current $I_{RLM}$. During normal operation, as opposed to startup, of the power rail 206, the first number of voltage regulators is determined based on the operation current of the power rail 206, rather than the transient load response time of the power rail 206 at each startup. The transient load response time of the power rail 206 can be achieved by a transient rail current that is less than the maximum rail current $I_{RLM}$.

Referring to FIG. 7A, power rail 206 has an instant rail current $I_R$ at a respective time, independently of whether the respective time corresponds to a startup or normal operation of power rail 206. In some embodiments, power array controller 602 generates control value 610 and operation enable signal 612 to enable all of the subset of voltage regulators 402 to provide the instant rail current $I_R$ of the power rail 206 collectively. Stated another way, none of the subset of voltage regulators 402 operates at a standby/redundant mode as the instant rail $I_R$ varies between 0 and the maximum rail current $I_{RLM}$. For example, first power rail 206-1 (FIG. 6) outputs the instant rail current $I_R$ that is equal to 0.5 $I_{RLM}$ at a time, and all 8 voltage regulators configured to provide the maximum rail current $I_{RLM}$ are enabled while being controlled by power array controller 602 to collectively provide only 0.5 $I_{RLM}$. Thus, in this example, only a portion of the power capability of each voltage regulator 402 is utilized. In some situations, the rail voltage $V_R$ associated with the instant rail current $I_R$ differs from the rail voltage $V_R$ associated with the maximum rail current $I_{RLM}$ by a first rail voltage error. The power array controller 602 and/or voltage regulators 402 are configured to maintain (e.g., limit, or control) the first rail voltage error within a rail drift tolerance $V_{RT}$.

Further, in some embodiments, the subset of voltage regulators 402 are controlled to contribute to the instant rail current $I_R$ substantially equally. For example, each voltage regulator 402 provides a respective portion to the instant rail current $I_R$, and the portion varies less than 5% (or 10%, 20% or other predefined margin) among the voltage regulators 402 configured to provide power to the same power rail 206. Each voltage regulator 402 may include an inter-regulator balancing circuit to balance the portion of the respective rail current $I_R$ provided by the respective voltage regulator 402 with at least another portion of the respective rail current $I_R$ provided by a distinct voltage regulator 402 in the subset of voltage regulators 402. In some implementations, the inter-regulator balancing circuit (e.g., 826 in FIG. 8B) is internal to each voltage regulator 402, and uses the portion of the respective rail current $I_R$ provided by the respective voltage regulator 402 as a negative feedback to control the portion of the respective rail current $I_R$ internally and independently of the other voltage regulators configured to provide power to the same power rail 206.

Referring to FIG. 7B, in some embodiments, one or more voltage regulators 402 are disabled in the subset of voltage regulators 402 and operate in a standby/redundant mode, e.g., under the control of operation enable signal 612, while a remainder of the subset of the voltage regulators 402 is enabled to provide the instant rail current $I_R$ of the corresponding power rail collectively. The one or more voltage regulators 402 have a second number of voltage regulators 402, and the second number is determined in accordance with a comparison between (e.g., ratio of) the instant rail current $I_R$ and the maximum regulator current $I_{RGM}$, or equivalently, in accordance with a comparison between (e.g., ratio of) the instant rail current $I_R$ and the maximum rail current $I_{RLM}$. For example, the subset of voltage regulators 402 has 8 voltage regulators, and the second number is equal to a value between 1 and 8. If the instant rail current $I_R$ is in a first range, e.g., (0, ⅛$I_{RLM}$, a first voltage regulator 402A is enabled to provide the instant rail current $I_R$. If the instant rail current $I_R$ increases to exceed ⅛$I_{RLM}$, ¼$I_{RLM}$, ⅜$I_{RLM}$, ½$I_{RLM}$, ⅝$I_{RLM}$, ¾$I_{RLM}$ and ⅞$I_{RLM}$ at respective times, voltage regulators 402B, 402C, 402D, 402E, 402F, 402G, and 402H are enabled (e.g., gradually or successively enabled) to provide the instant rail current $I_R$ in corresponding rail current ranges, at those respective times. Further, in some embodiments, while the second number of voltage regulators 402 operate in the standby/redundant mode, the remainder of the subset of the voltage regulators 402 is controlled to contribute to the instant rail current $I_R$ substantially equally, e.g., each enabled voltage regulator 402 provides a respective portion to the instant rail current $I_R$ that varies less than 5% (or 10%, 20% or other predefined margin) among voltage regulators 402 associated with the same power rail 206.

In some situations, when one or more voltage regulators 402 operate in the standby/redundant mode, the rail voltage $V_R$ associated with the instant rail current $I_R$ is distinct from the rail voltage $V_R$ associated with the maximum rail current $I_{RLM}$ by a second rail voltage error. The second rail voltage error is controlled (e.g., by the power array controller 602 and/or voltage regulators 402) so as to maintain (e.g., limit, or control) the second rail voltage error within the rail drift tolerance $V_{RT}$. When the same rail current $I_R$ is provided with at least one redundant regulator (FIG. 7B) or without redundant regulators (FIG. 7A), the second rail voltage error is less than the first rail voltage error, and involvement of the redundant regulator(s) 402 provides a higher accuracy for the rail voltage $V_R$ with more complicated regulator controls.

Figure 8A:
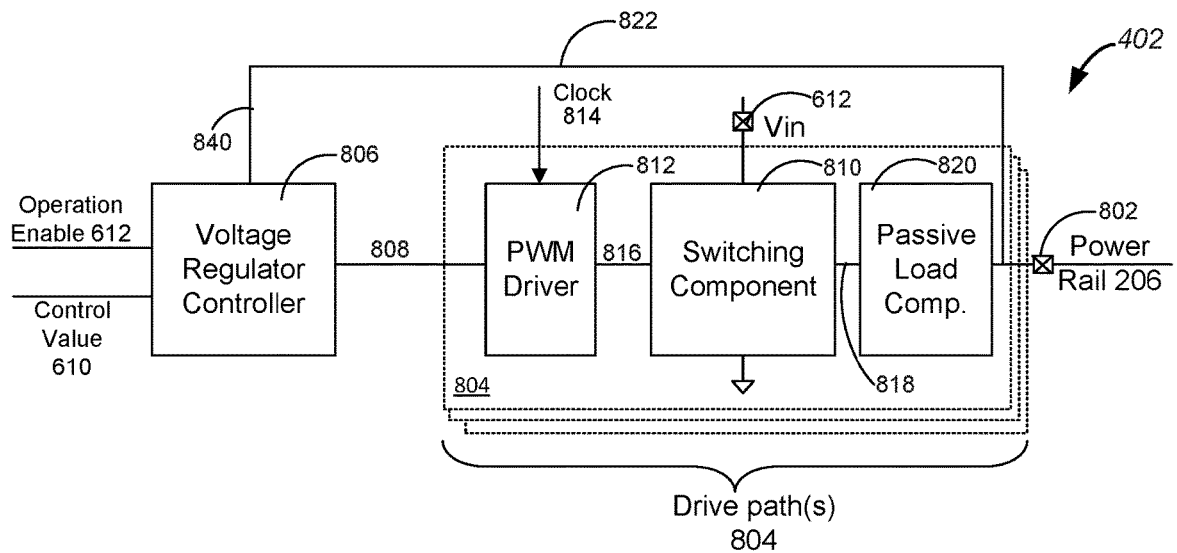
FIG. 8A is a block diagram of a voltage regulator used as a basic unit to form a field programmable array, in accordance with some embodiments.

In some embodiments, each voltage regulator 402 in field programmable array 400 is FIG. 8A is a block diagram of a voltage regulator 402, which one of the voltage regulators in field programmable array 400, in accordance with some embodiments. In field programmable array 400, a power rail 206 is electrically coupled to a plurality of voltage regulators 402 configured to provide a corresponding rail voltage $V_R$ collectively to that power rail. Each voltage regulator 402 includes an output interface 802, one or more drive paths 804, and a voltage regulator controller 806. Output interface 802 is electrically coupled to power rail 206 to output the rail voltage $V_R$. The one or more drive paths 804 are coupled in parallel between voltage regulator controller 806 and output interface 802, and each drive path 804 is configured to operate during a respective phase and with an operating frequency to provide a respective path current $I_P$ to the power rail 206. The respective path current $I_P$ becomes a portion of a rail current $I_R$ injected to power rail 206. Voltage regulator controller 806 is configured to receive control value 610 and operation enable signal 612 from a power array controller 602 and generate a path control signal 808 to control the one or more drive paths 804.

Voltage regulator 402 includes a feedback path 822 coupling output interface 802 to voltage regulator controller 806. That said, voltage regulator controller 806 has a feedback input 840 configured to receive an output voltage of output interface 802. Voltage regulator controller 806 is configured to adjust path control signal 808 dynamically based on the output voltage of output interface 802 and generate the rail voltage $V_R$ as defined by control value 610. Specifically, in some embodiments, path control signal 808 defines a duty cycle that is dynamically adjusted by voltage regulator controller 806 in accordance with a comparison of the output voltage of output interface 802 with the rail voltage $V_R$ as defined by control value 610.

Voltage regulator 402 includes a buck converter, i.e., a DC-DC switch mode converter, which operates based on an integrated switch. Each drive path 804 includes a switching component 810 and a pulse width modulation (PWM) driver 812. PWM driver 812 is coupled between voltage regulator controller 806 and switching component 810. PWM driver 812 receives a clock signal 814 (e.g., multi-phase clock 518) and path control signal 808 to control switching component 810. Specifically, path control signal 808 defines a duty cycle, and clock signal 814 has a frequency equal to the operating frequency of the one or more drive paths 804. PWM driver 812 is configured to modify clock signal 814 with path control signal 808 to generate a switching signal 816. Switching component 810 is controlled by switching signal 816 to turn on and off according to the duty cycle, at the operating frequency. Switching component 810 is also coupled to a DC power supply interface 616 and configured to be powered by a corresponding DC supply voltage $V_{IN}$, which is thereby outputted to a switch output 818 of switching component 810 according to the duty cycle and with the operating frequency. Switch output 818 of switching component 810 is further conditioned (e.g., filtered) by a passive load component 820 (e.g., a serial inductor) to generate the rail voltage $V_R$. The rail voltage is outputted to power rail 206 via output interface 802. In some implementation, the rail voltage $V_R$ is substantially constant (e.g., has an output ripple voltage less than a ripple tolerance), and has an average magnitude equal to a product of the DC supply voltage $V_{IN}$, the duty cycle, and a conversion efficiency of switching component 810.

Figure 8B:
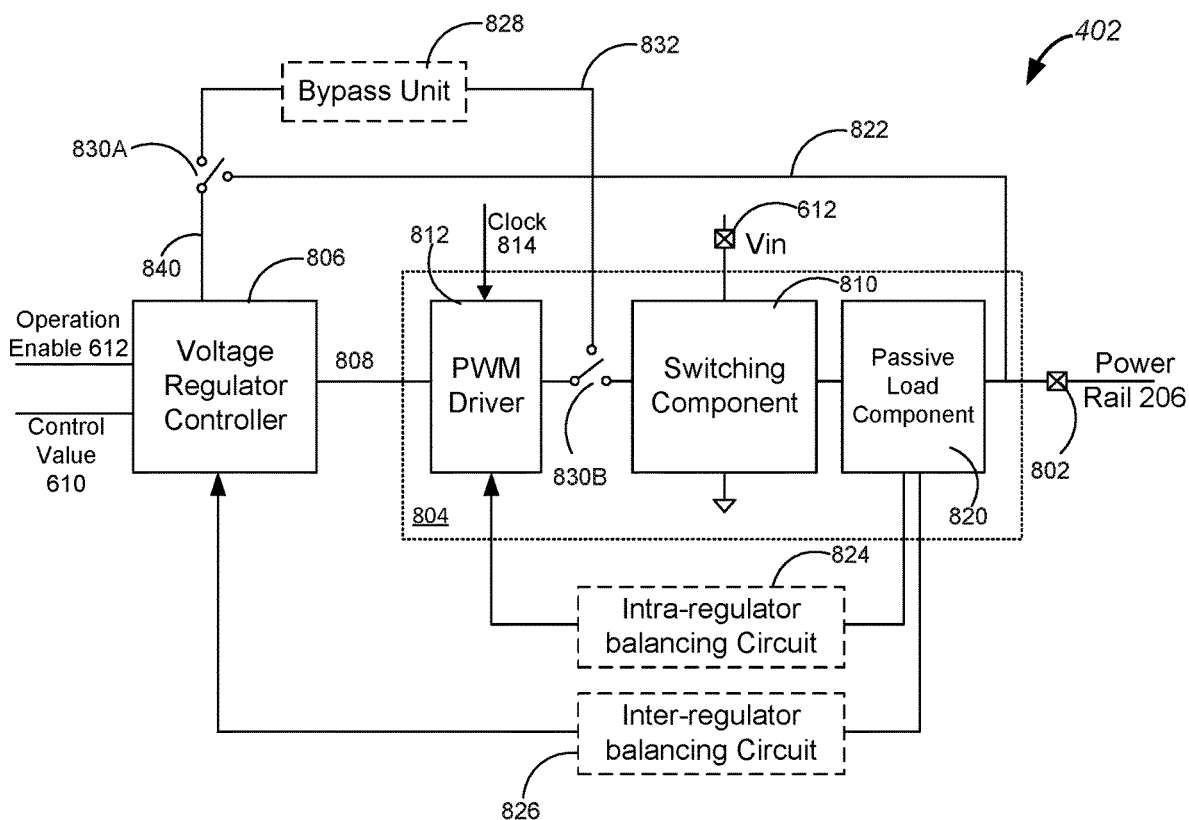
FIG. 8B is a block diagram of a voltage regulator using current balancing and/or redundancy controlling, in accordance with some embodiments.

FIG. 8B is a block diagram of voltage regulator 402 using current balancing and/or redundancy controlling, in accordance with some embodiments. In some embodiments, voltage regulator 402 further includes one or more of: an intra-regulator balancing circuit 824, an inter-regulator balancing circuit 826, and a bypass unit 828. Intra-regulator balancing circuit 824, inter-regulator balancing circuit 826, and bypass unit 828 are internal to voltage regulator 402. In some embodiments, each individual voltage regulator 402 can independently disable current outputs, balance currents internally, and/or balance its contribution to the rail current $I_R$ with other voltage regulators driving the same power rail 206. Specifically, in some embodiments, when voltage regulator 402 includes a plurality of drive paths 804, intra-regulator balancing circuit 824 is coupled between passive load components 820 of drive paths 804 and at least one of PWM drivers 812 of drive paths 804. Intra-regulator balancing circuit 824 is configured to monitor drive paths 804 (e.g., monitor a current passing through switching component 810 and passive load component 820) and control at least one of PWM drivers 812 to adjust at least one duty cycle of drive paths 804 and balance respective path currents of drive paths 804 dynamically.

In some embodiments, voltage regulator 402 includes one or more drive paths 804, and inter-regulator balancing circuit 826 is coupled from passive load components 820 and output interface 802 to voltage regulator controller 806. For each voltage regulator 402, inter-regulator balancing circuit 826 is configured to balance a portion of the respective rail current $I_R$ provided by the respective voltage regulator 402 with at least another portion of the respective rail current $I_R$ provided by a distinct voltage regulator 402 in the subset of voltage regulators 402 selected to power the same power rail 206, e.g., based on the portion of respective rail current $I_R$ provided by the respective voltage regulator itself. Specifically, in some embodiments, inter-regulator balancing circuit 826 is configured to monitor the portion of the respective rail current $I_R$ and control path control signal 808 based on the portion of the respective rail current $I_R$ itself. For each voltage regulator 402, the portion of the respective rail current $I_R$ that passes through switching component 810 and passive load component 820 is monitored by inter-regulator balancing circuit 826. In some situations, if the portion of the respective rail current provided by a respective voltage regulator is relatively large, control path control signal 808 reduces the duty cycles of drive paths 804 (of that respective voltage regulator) to suppress the portion of the respective rail current $I_R$; if the portion of the respective rail current provided by the respective voltage regulator is relatively small, control path control signal 808 increases the duty cycles of drive paths 804 to boost up the portion of the respective rail current $I_R$.

Conversely, in some embodiments now shown, inter-regulator balancing circuit 826 of a first voltage regulator 402 is also coupled to passive load components 820 and output interface 802 of a second voltage regulator 402 that is distinct form the first voltage regulator 402 and powers the same power rail 206 jointly with the first voltage regulator 402. Inter-regulator balancing circuit 826 is configured to balance the portion of the respective rail current $I_R$ provided by the first voltage regulator 402 with the portion of the respective rail current $I_R$ provided by the second voltage regulator 402, in accordance with a comparison of the portions of the rail current $I_R$ provided by the first and second voltage regulators.

Figure 13:
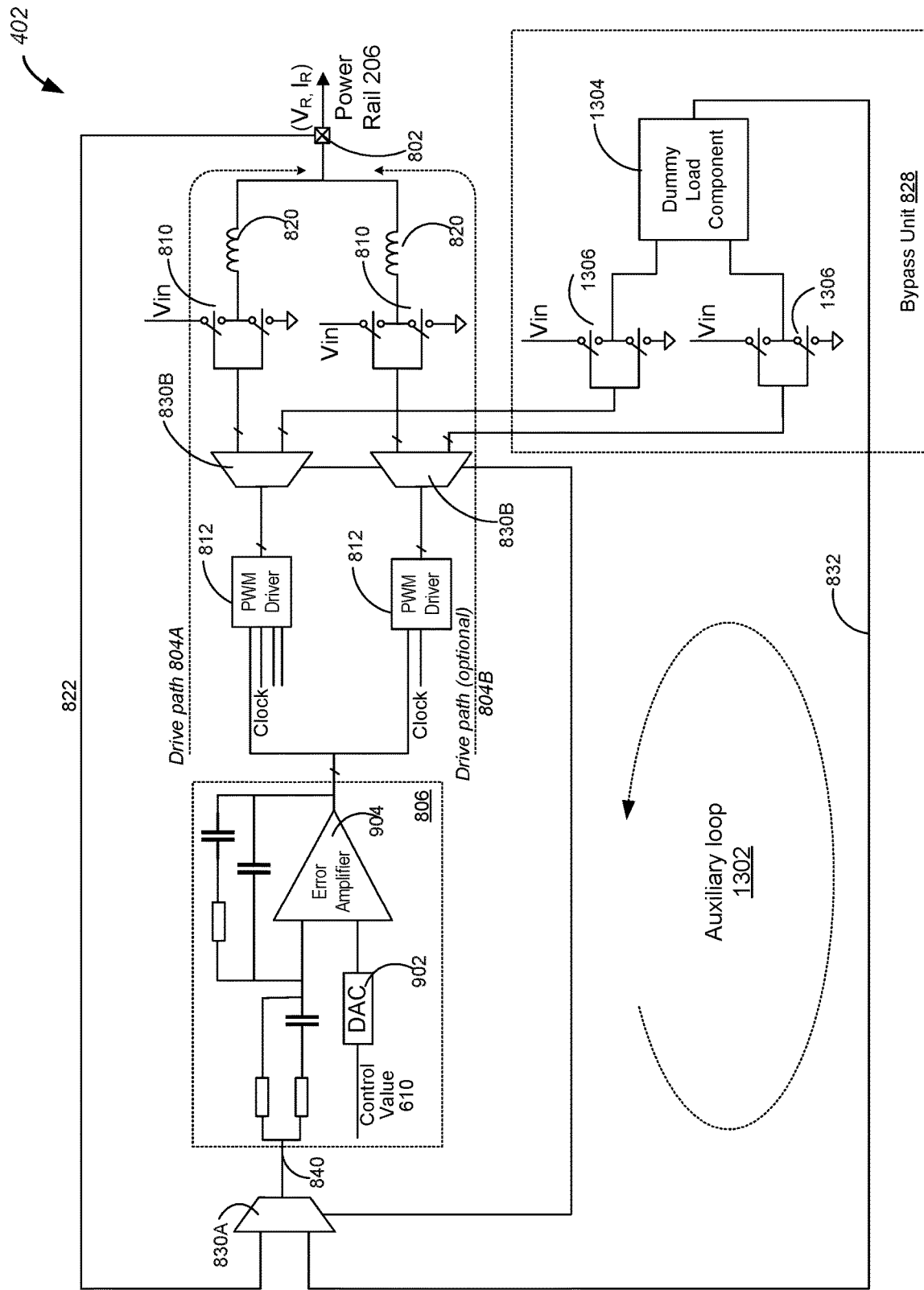
FIG. 13 is a circuit diagram of a voltage regulator of a field programmable array of voltage regulators having an auxiliary loop to control redundancy, in accordance with some embodiments.

Bypass unit 828 is used to enable a standby/redundancy mode in which voltage regulator 402 is disabled from contributing to a rail current $I_R$ of a corresponding power rail. The standby/redundancy mode is optionally applied when voltage regulator 402 (e.g., 402E in FIG. 6) is applied to drive a power rail 206 or when voltage regulator 402 (e.g., 402RA-402RD in FIG. 6) is not applied to drive any power rail 206. Bypass unit 828 is coupled to the one or more drive paths 804 and voltage regulator controller 806, and configured to provide a dummy load component (e.g., including a passive RC filter) in place of a load coupled to power rail 206. In the standby/redundancy mode, bypass unit 828 is enabled to bypass feedback path 822 from output interface 802 to the input of voltage regulator controller 806, thereby disabling respective voltage regulator 402 from contributing to the respective rail current $I_R$. In an example as shown in FIG. 8B, a switch 830A breaks and is inserted into feedback path 822, and a switch 830B breaks and is inserted into an interconnect carrying switching signal 816 in each drive path 804. In some implementations, each of switches 830A and 830B includes a multiplexer, and is controlled by operation enable signal 612 received by voltage regulator 402. Bypass unit 828 is coupled between switch 830A and switch 830B of each drive path 804, and configured to intercept switching signal 816 and decouple power rail 206 and feedback path 822 from voltage regulator controller 806. As such, bypass unit 828 enables an auxiliary path 832 to bypass feedback path 822 in the standby/redundancy mode. An example of an implementation of bypass unit 828 is shown in FIG. 13, described below.

Figure 9:
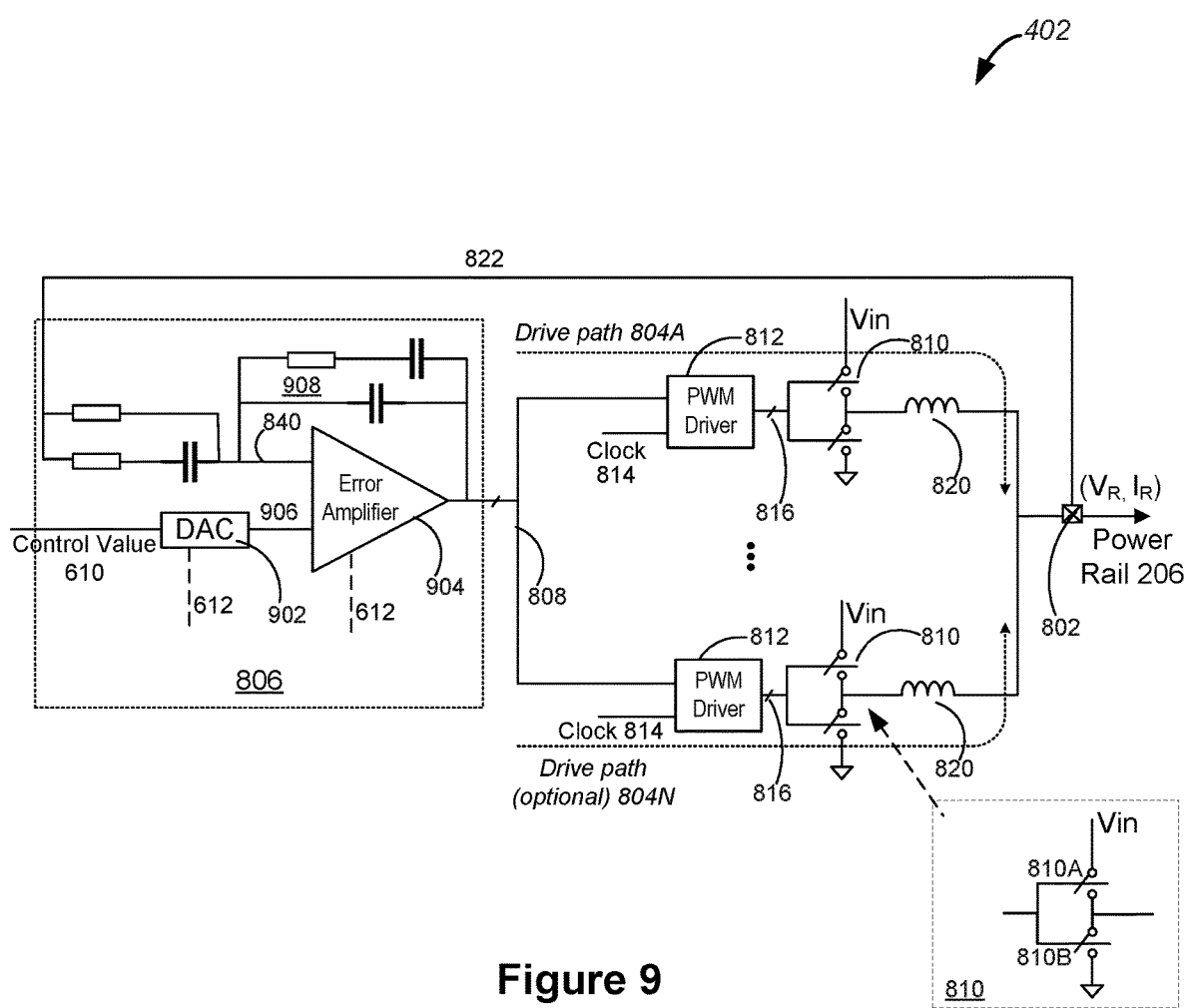
FIG. 9 is a circuit diagram of a voltage regulator having a plurality of drive paths 804, in accordance with some embodiments.

FIG. 9 is a circuit diagram of a voltage regulator 402 having a plurality of drive paths 804, in accordance with some embodiments. Voltage regulator controller 806 is coupled to, and provides path control signal 808 to, each of drive paths 804A-804N. A feedback path 822 connects an output interface 802 of drive paths 804A-804N to a feedback input 840 of voltage regulator controller 806. In some embodiments, voltage regulator controller 806 includes a digital-to-analog converter (DAC) 902, an error amplifier 904, and amplifier feedback circuit, and is configured to enable pulse width modulation for drive paths 804A-804N. Control value 610 is applied by DAC 902 to generate a reference voltage 906, which is received at an input of error amplifier 904. The amplifier feedback circuit and feedback path 822 dynamically controls the rail voltage $V_R$ outputted at output interface 802 to match reference voltage 906. Specifically, path control signal 808 is generated by voltage regulator controller 806 to control duty cycles of drive paths 804A-804N to match the rail voltage $V_R$ and reference voltage 906. In some situations, power array controller 602 also provides an operation enable signal 612 to each voltage regulator 402 to enable generating the respective rail voltage $V_R$ and the respective rail current $I_R$. Operation enable signal 612 is optionally applied to control (e.g., enable and disable) error amplifier 904 and/or DAC 902.

Each of drive paths 804A-804N further includes a passive load component 820 coupled to output interface 802, a PWM driver 812, and a switching component 810. PWM driver 812 is configured to receive a clock signal 814 having an operating frequency and modulate the clock signal 814 to provide a switching signal 816 with a phase. Power switching component 810 is coupled between PWM driver 812 and passive load component 820, and is configured to couple passive load component 820 to one or more DC supply voltages $V_{IN}$ under the control of switching signal 816. In some embodiments, switching component 810 includes a first transistor 810A and a second transistor 810B that are controlled by switching signal 816 to couple passive load component 820 to DC supply voltage $V_{IN}$ and a ground, respectively.

Figure 10A:
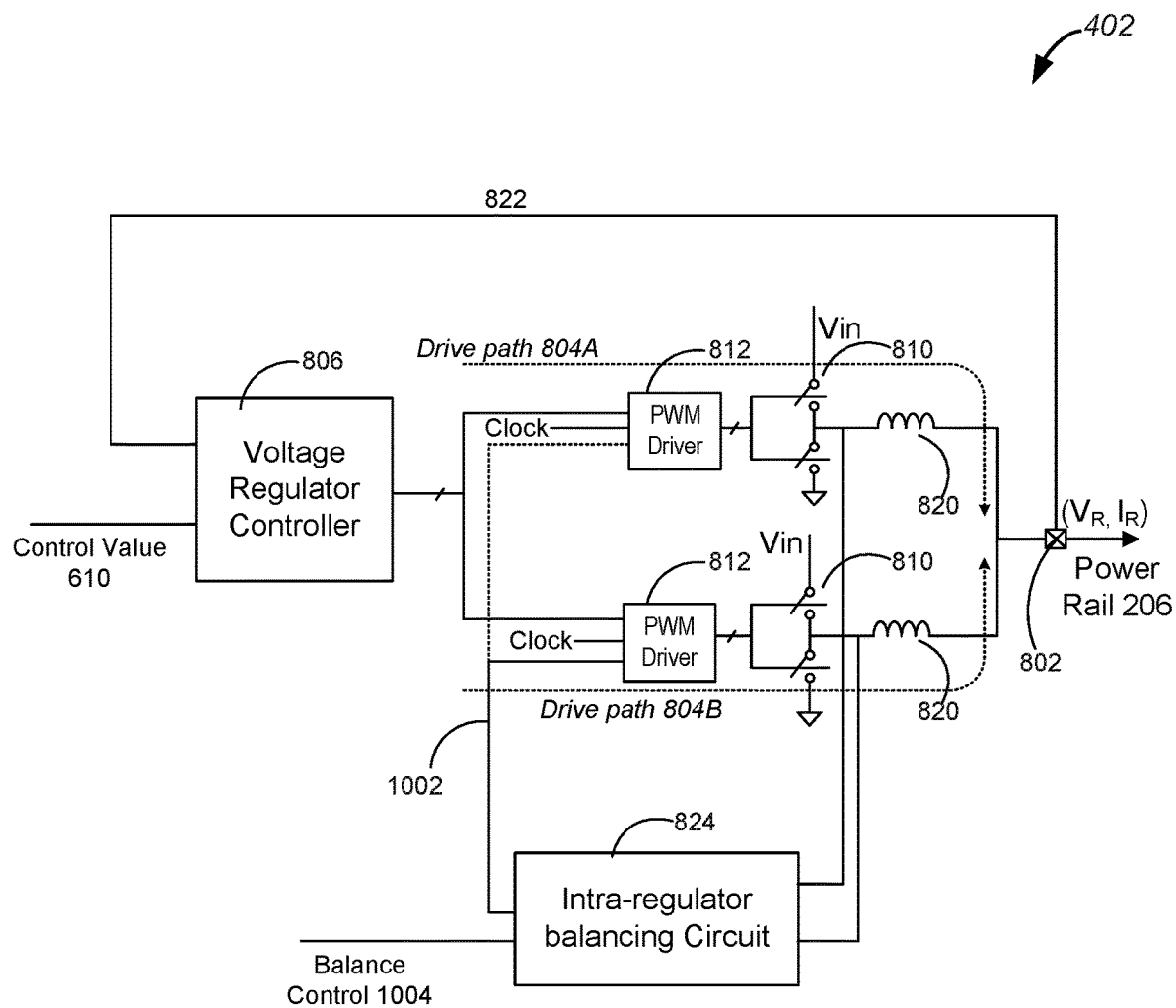
FIG. 10A is a circuit diagram of a voltage regulator having two drive paths that are balanced by an intra-regulator balancing circuit, in accordance with some embodiments.

FIG. 10A is a circuit diagram of a voltage regulator 402 having two drive paths 804A and 804B that are balanced by an intra-regulator balancing circuit 824, in accordance with some embodiments. Voltage regulator 402 is one of a plurality of voltage regulators 402 that are electrically coupled to a power rail 206 and configured to provide the rail voltage $V_R$ collectively to the power rail 206. Voltage regulator 402 includes a first drive path 804A coupled to output interface 802 and configured to operate during a first phase and with an operating frequency to provide a first path current $I_{P1}$ to the power rail 206. A second drive path 804 is coupled to output interface 802 and configured to operate during a second phase and with the operating frequency to provide a second path current $I_{P2}$ to the power rail 206. Second drive path 804B is electrically coupled in parallel with first drive path 804A. In some situations, the first phase and the second phase are identical and have the same duty cycle. In some situations, the first phase and the second phase are distinct from each other. A first duty cycle of the first phase is equal to, but is offset from, a second duty cycle of the second phase. The first duty cycle of the first phase is partially overlapping or entirely offset from the second duty cycle of the second phase.

Intra-regulator balancing circuit 824 is coupled to first and second drive paths 804A and 804B, and configured to sense the first and second path currents $I_{P1}$ and $I_{P2}$ and generate a control signal 1002 to control the first duty cycle of the first phase, the second duty cycle of the second phase, or both based on a difference of the first and second path currents $I_{P1}$ and $I_{P2}$. For example, if intra-regulator balancing circuit 824 determines that the first path current $I_{P1}$ is greater than the second path current $I_{P2}$, it controls PWM driver 812A of first drive path 804A to decrease the first duty cycle to reduce the first path current $I_{P1}$ or controls PWM driver 812B of second drive path 804B to increase the second duty cycle to increase the second path current $I_{P2}$. In some embodiments, intra-regulator balancing circuit 824 is always enabled (e.g., by a balance control 1004) to balance the path currents $I_{P1}$ and $I_{P2}$ between two drive paths 804A and 804B dynamically. In some embodiments, intra-regulator balancing circuit 824 is enabled to balance the path currents $I_{P1}$ and $I_{P2}$ between two drive paths 804A and 804B periodically or in response to an instruction received from SoC 102.

In some embodiments, intra-regulator balancing circuit 824 determines that the difference of the first and second path currents $I_{P1}$ and $I_{P2}$ does not satisfy a path current balancing criterion. In an example, the path current balancing criterion requires an absolute value of the difference does not exceed a current threshold (e.g., 0.1 mA) or a percentage threshold (e.g., 5%). In accordance with a determination that the difference of the first and second path currents does not satisfy the path current balancing criterion and a determination that the first path current is greater than the second path current, voltage regulator 402 implements one or both of reducing the first duty cycle of the first phase and increasing the second duty cycle of the second phase, until the difference of the first and second path currents satisfies the path current balancing criterion. Alternatively, under some circumstances, the path current balancing criterion requires that the first and second path currents $I_{P1}$ and $I_{P2}$ to be equal (i.e., their difference be zero), and voltage regulator 402 adjusts the first phase of drive path 804A and/or the second phase of drive path 804B whenever the path currents $I_{P1}$ and $I_{P2}$ are not equal.

The difference of the first and second path currents $I_{P1}$ and $I_{P2}$ is caused by various factors, including a mismatch of PWM drivers 812, switching components 810, or passive load components 820 of corresponding drive paths 804. Intra-regulator balancing circuit 824 enables an internal analog current balancing loop within each voltage regulator 402 to correct the mismatch of first and second drive paths 804A and 804B, without requiring digital signal processing or adding input/out signals. In an example, the analog current balancing loop enabled by intra-regulator balancing circuit 824 includes an integral loop.

Figure 10B:
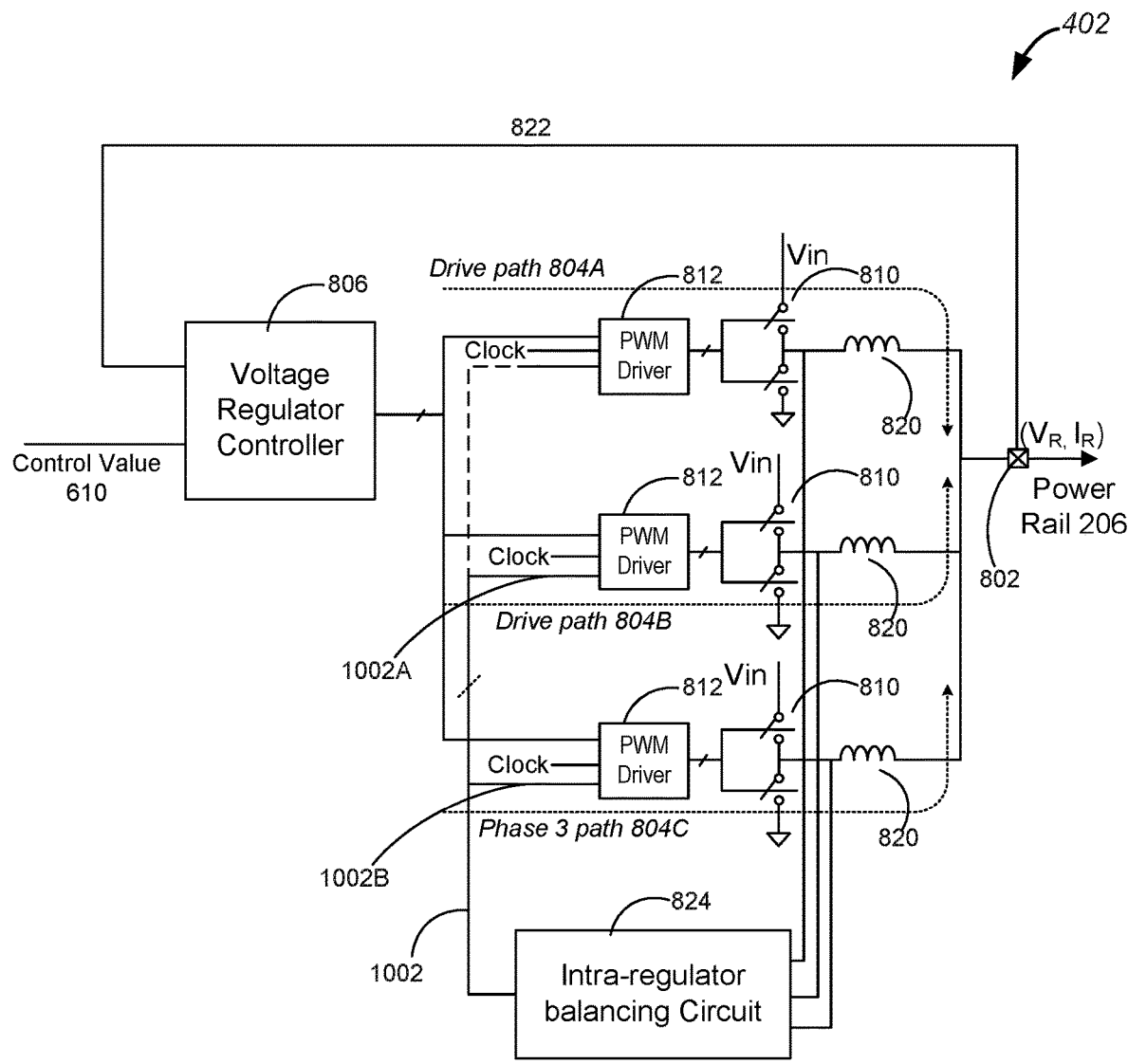
FIG. 10B is a circuit diagram of a voltage regulator having more than two (e.g., three) drive paths that are balanced by an intra-regulator balancing circuit, in accordance with some embodiments.

FIG. 10B is a circuit diagram of a voltage regulator 402 having more than two (e.g., three) drive paths 804 that are balanced by an intra-regulator balancing circuit 824, in accordance with some embodiments. Like drive paths 804A and 804B, at least a third drive path 804C is coupled to output interface 802 and configured to operate during a third phase, at the operating frequency of drive paths 804A and 804B, to provide a third path current $I_{P3}$ to the power rail 206 jointly with first drive path 804A and second drive path 804B. Third drive path 804C is electrically coupled in parallel with first and second drive paths 804A and 804B. In some embodiments, control signal 1002 includes a first control signal 1002A generated to control the second duty cycle of the second phase based on the difference of the first and second path currents $I_{P1}$ and $I_{P2}$. Intra-regulator balancing circuit 824 is coupled to third drive path 804C and configured to sense the third path current $I_{P3}$ and generate a second control signal 1002B to control a third duty cycle of the third phase based on a difference of the first and third path currents $I_{P1}$ and $I_{P3}$. By these means, both the first path current $I_{P1}$ is used as a reference, and each of other drive paths 804 is adjusted to match a respective path current with the first path current $I_{P1}$.

Alternatively, in some embodiments, intra-regulator balancing circuit 824 is coupled to third drive path 804C and configured to sense the third path current $I_{P3}$ and generate the control signal 1002 to control the first duty cycle of the first phase based on a difference of the first and second path currents $I_{P1}$ and $I_{P2}$ and based on a difference of the first and third path currents $I_{P2}$ and $I_{P3}$. The first path current $I_{P1}$ may be adjusted to be between the second and third path currents $I_{P2}$ and $I_{P3}$ to reduce variations among path currents $I_{P1}$-$I_{P3}$. In some situations, a smallest difference corresponding to a first pair of drive paths 804 is identified among differences among any pair of drive paths 804A-804C, and a duty cycle of a remainder of drive paths 804A-804C is adjusted to a value between the duty cycles of drive paths in the first pair. As such, only one of the duty cycles of three drive paths 804A-804C is adjusted to enhance a balance among path currents $I_{P1}$, $I_{P2}$ and $I_{P3}$.

Figure 10C:
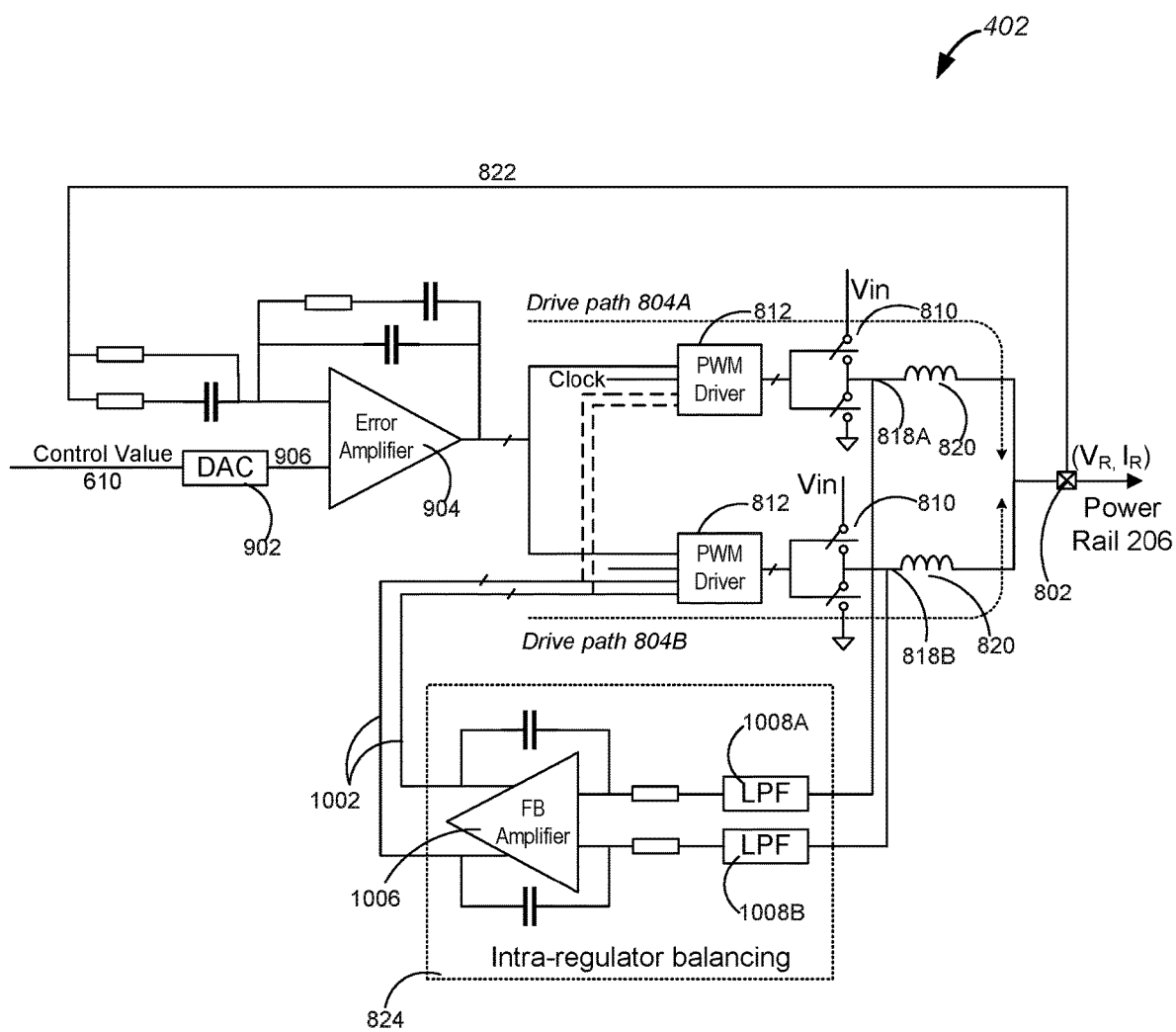
FIG. 10C is a circuit diagram of a voltage regulator balancing drive paths with a differential amplifier, in accordance with some embodiments.

FIG. 10C is a circuit diagram of a voltage regulator 402 balancing drive paths 804 with a differential amplifier 1006, in accordance with some embodiments. Intra-regulator balancing circuit 824 includes one or more differential amplifiers 1006. Each differential amplifier 1006 is coupled to two of drive paths 804. Specifically, switch outputs 818A and 818B of drive paths 804A and 804B are filtered by low pass filters 1008A and 1008B coupled to differential inputs of amplifier 1006 to remove high frequency noise in switch outputs 818A and 818B. Differential amplifier 1006 generates control signal 1002 to control a first duty cycle of the first phase, a second duty cycle of the second phase, or both based on switch output 818A and 818B. Control signal 1002 is optionally a single-ended signal or a differential signal. As such, if activated, differential amplifier 1006 enables adjustment of the first phase of drive path 804A and/or the second phase of drive path 804B whenever the path currents $I_{P1}$ and $I_{P2}$ are not balanced.

Figure 11A:
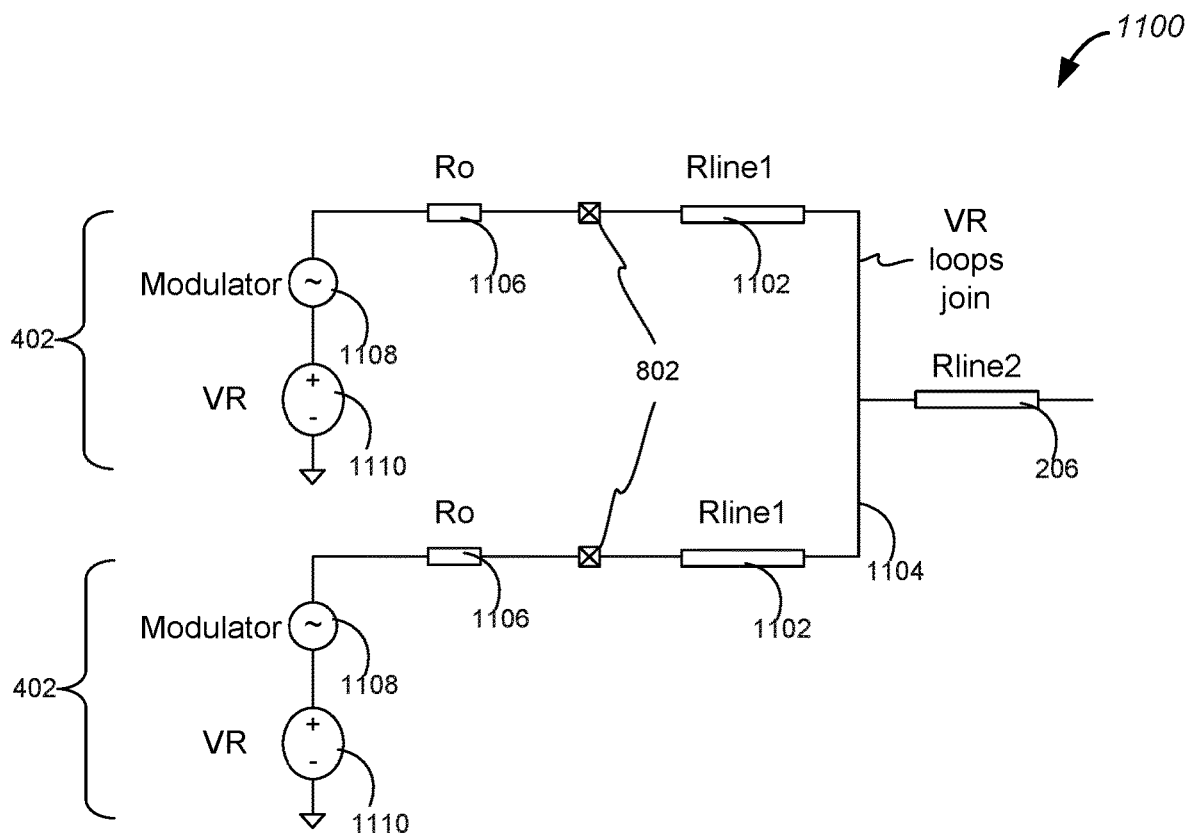
FIG. 11A is an equivalent circuit diagram of a power rail that is driven by two voltage regulators in a field programmable array of voltage regulators, in accordance with some embodiments.

FIG. 11A is an equivalent circuit diagram 1100 of a power rail 206 that is driven by two voltage regulators 402 in a field programmable array 400 of voltage regulators, in accordance with some embodiments. For inter-regulator current balancing, each voltage regulator 402 is simplified and corresponds to a voltage source 1110 according to a voltage source model. Power rail 206 powered by these voltage regulators 402 is configured to power a subset of SoC 102. For each voltage regulator 402, output interface 802 is physically located within a footprint of the respective voltage regulator 402 and connected to power rail 206 via a first interconnect 1102 having resistance Rline1 that optionally includes parasitic resistance of first interconnect 1102. In some situations, first interconnects 1102 of voltage regulators 402 merge to form power rail 206 at a regulator joint 1104, e.g., DC connections 308 in FIG. 4B. In some situations, first interconnects 1102 of three or more voltage regulators 402 merge to form power rail 206 at more than one regulator joint 1104. Optionally, the more than one regulator joint 1104 is used with additional interconnects connecting the more than one regulator joint 1104. Optionally, a common regulator joint 1104 is determined by adjusting equivalent resistances of first interconnects 1102 of voltage regulators 402 powering power rail 206. Power rail 206 is routed from regulator joint 1104 with distributed resistance Rline2 that optionally includes parasitic resistance of power rail 206. Each voltage regulator 402 has an output impedance $R_o$ 1106.

In some embodiments, a mismatch between the two voltage regulators 402 corresponds to an internal error in one or more of the voltage regulators 402, e.g., caused by a reference voltage error of DAC 902 and/or an offset voltage of error amplifier 904 of voltage regulator controller 806. The resistance Rline1 of first interconnect 1102 is negligible. The distributed resistance Rline2 of power rail 206 does not impact the mismatch between the two voltage regulators 402. In some embodiments, an output current of each voltage regulator 402 is sensed and used to control an offset input of error amplifier 904, thereby counteracting the offset voltage of error amplifier 904. In some implementations, a modulator 1108 is integrated in each voltage regulator 402 to compensate the internal error of the respective voltage regulator 402. For example, modulator 1108 is implemented as an inter-regulator balancing circuit 826 in FIG. 8B, 12A or 12B.

Figure 11B:
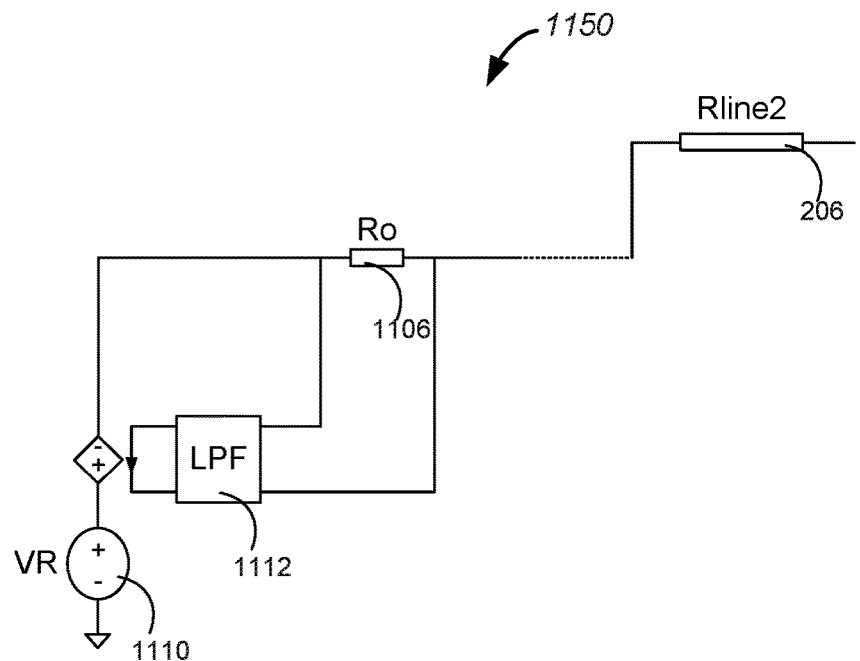
FIG. 11B is an equivalent circuit diagram of a single voltage regulator that uses a low pass filter (LPF) for inter-regulator current balancing, in accordance with some embodiments.

In some embodiments, modulator 1108 includes a low pass filter (LPF) 1112. FIG. 11B is an equivalent circuit diagram 1150 of a single voltage regulator 402 that uses LPF 1112 for inter-regulator current balancing, in accordance with some embodiments. A voltage drop of output impedance $R_o$ 1106 of voltage regulator 402 corresponds to an output current of voltage regulator 402, i.e., a portion of the rail current $I_R$ contributed by voltage regulator 402. The voltage drop is extracted, filtered to reduce high frequency noise by LPF 1112, and applied to voltage regulator controller 806 (e.g., error amplifier 904) with a scale factor (e.g., 1). LPF 1112 enables a negative feedback to counteract and compensate for the internal error of voltage regulator 402. This current balancing configuration is implemented internally within voltage regulator 402 without requiring any input or control from other voltage regulators 402 driving the same power rail 206 or power array controller 602.

Figure 12A:
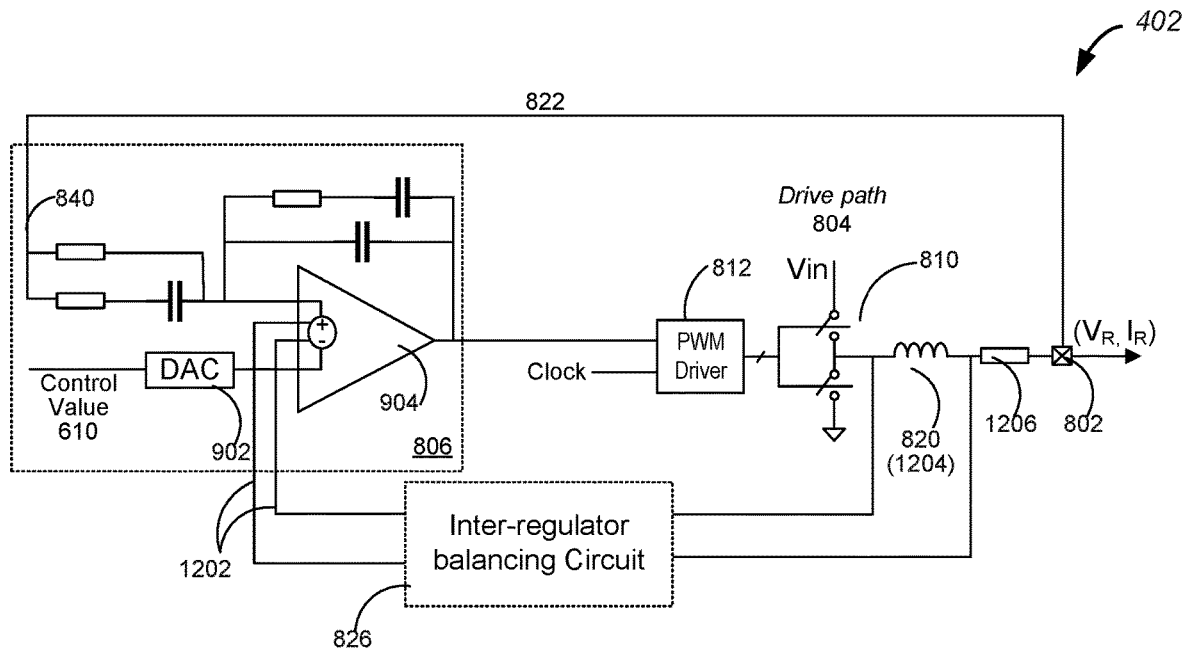
FIGS. 12A and 12B are circuit diagrams of a voltage regulator that is controlled by an inter-regulator balancing circuit in accordance with some embodiments.
Figure 12B:
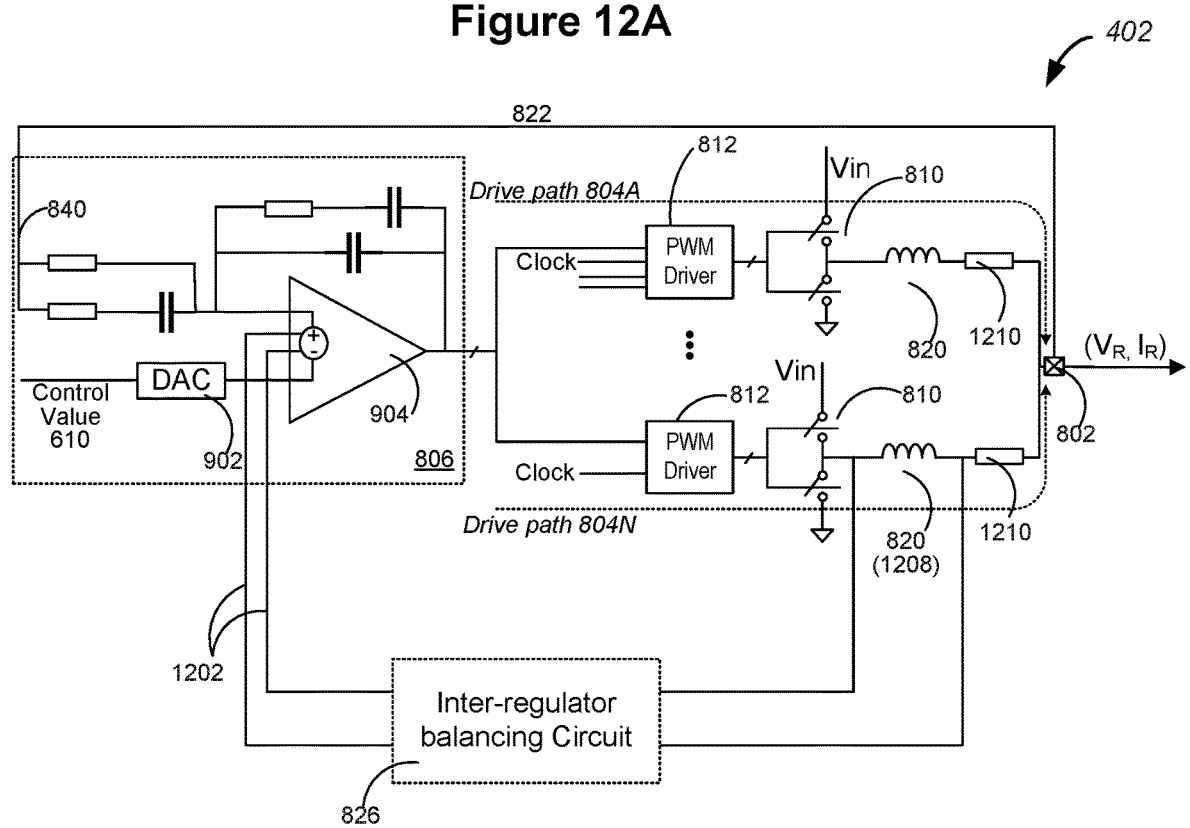

FIGS. 12A and 12B are circuit diagrams of voltage regulator 402 that is controlled by an inter-regulator balancing circuit 826 in accordance with some embodiments. Inter-regulator balancing circuit 826 is coupled to output interface 802 and voltage regulator controller 806, and configured to sense an output current of the respective voltage regulator 402 and apply an offset 1202 to a control input of voltage regulator controller 806. The offset 1202 is determined based on the sensed output current of voltage regulator 402. In some embodiments, voltage regulator controller 806 includes an error amplifier 904 configured to receive the control input and apply the offset 1202 between the feedback input 840 and a control value that defines the rail voltage of power rail 206 powered by this voltage regulator 402.

Referring to FIG. 12A, in some embodiments, inter-regulator balancing circuit 826 is coupled to an output inductor 1204 of passive load component 820 coupled at output interface 802. Inter-regulator balancing circuit 826 is configured to sense the output current of voltage regulator 402 based on a voltage drop across output inductor 1204. Alternatively, in some embodiments, an output resistor 1206 having a substantially small resistance (e.g., less than a threshold resistance) is coupled in series at output interface 802. Inter-regulator balancing circuit 826 is coupled to output interface 802 via output resistor 1204, and the output current of voltage regulator 402 is sensed from a voltage drop across output resistor 1204. As such inter-regulator balancing circuit 826 is configured to sense the output current of voltage regulator 402, and apply offset 1202 to the control input received by voltage regulator controller 806. Offset 1202 is determined directly based on the output current of voltage regulator 402, specifically based on the voltage drop across output inductor 1204 or output resistor 1206.

Referring to FIG. 12B, in some embodiments, voltage regulator 402 includes a plurality of drive paths 804 having path currents that are optionally balanced with each other. In some embodiments, inter-regulator balancing circuit 826 is coupled to a path inductor 1208 of passive load component 820 in one of drive paths 804. Inter-regulator balancing circuit 826 is configured to sense one of the plurality of path currents $I_P$ of voltage regulator 402 based on a voltage drop across path inductor 1208. Alternatively, in some embodiments, a path resistor 1210 having a substantially small resistance (e.g., less than a threshold resistance) is coupled in series in one of the plurality of drive paths 804. Inter-regulator balancing circuit 826 is coupled to path resistor 1210, and the output current of voltage regulator 402 is sensed and determined indirectly from a voltage drop across path resistor 1210. That said, inter-regulator balancing circuit 826 is configured to sense one of the plurality of path currents $I_P$ of voltage regulator 402, and apply offset 1202 to the control input received by voltage regulator controller 806. Offset 1202 is determined based on the sensed one of the plurality of path currents $I_P$, specifically based on the voltage drop across path inductor 1208 or path resistor 1210.

In some embodiments, inter-regulator balancing circuit 826 includes two LPFs that are coupled to two ends of one of output inductor 1204, output resistor 1206, path inductor 1208, and path resistor 1210, respectively. Offset 1202 is determined based on a DC and low frequency portion of the output current of voltage regulator 402.

In some embodiments, voltage regulator 402 includes both intra-regulator balancing circuit 824 (not shown in FIG. 12B) configured to balance the path currents $I_{P1}$ and $I_{P2}$ and inter-regulator balancing circuit 826 configured to control the output current of voltage regulator 402, i.e., a corresponding portion of the rail current $I_R$ that is provided to power rail 206 associated with this voltage regulator 402. In some embodiments, voltage regulator 402 includes only one of intra-regulator balancing circuit 824 and inter-regulator balancing circuit 826.

FIG. 13 is a circuit diagram of a voltage regulator 402 of a field programmable array 400 of voltage regulators having an auxiliary loop 1302 to control redundancy, in accordance with some embodiments. As explained above, voltage regulator 402 has a standby/redundancy mode in which voltage regulator 402 (e.g., 402RA-402RD) is not enabled to power any power rail 206 or in which voltage regulator 402 (e.g., 402H in FIG. 7B) is used to drive a power rail 206, but temporarily disabled from contributing to a corresponding rail current $I_R$ of power rail 206. In some embodiments, regardless of whether voltage regulator 402 is coupled to any power rail 206, voltage regulator 402 includes an output interface 802, one or more drive paths 804, a voltage regulator controller 806, and a bypass unit 828. Voltage regulator controller 806 has an output coupled to the one or more drive paths 804 and a feedback input 840 coupled to output interface 802 by a feedback path 822. Bypass unit 828 is coupled to the one or more drive paths 804 and voltage regulator controller 806, and configured to provide a dummy load component 1304. In the standby/redundancy mode, when bypass unit 828 is enabled, auxiliary loop 1302 bypasses the feedback path 822 from output interface 802 to the input of voltage regulator controller 806 and drives dummy load component 1304 with one or more switching components 1306. As such, auxiliary loop 1302 includes the bypass unit 828 and is enabled in place of the feedback path 822 in the standby/redundancy mode to disable voltage regulator 402 from contributing to the corresponding rail current $I_R$ of power rail 206.

In the standby/redundancy mode, bypass unit 828 is enabled to bypass switching component 810 and passive load component 820 of each drive path 804. Each drive path 804 further includes a multiplexer or switch 830B coupled to PWM driver 812, switching component 810 and bypass unit 828. Multiplexer or switch 830B is configured to select bypass unit 828 and deselect switching component 810 and electrically couple PWM driver 812 to bypass unit 828 in the standby/redundancy mode. Voltage regulator 402 further includes a multiplexer or switch 830A coupled between feedback input 840 of voltage regulator controller 806 and output interface 802. Multiplexer or switch 830A is configured to operate concurrently with multiplexer or switch 830B of each drive path 804 to select bypass unit and deselect output interface 802 for the input of voltage regulator controller 806. In some embodiments, operation enable signal 612 is used to control multiplexer or switch 830A, multiplexer or switch 830B, and dummy load component 1304 concurrently to enable the standby/redundancy mode. By these means, in the standby/redundancy mode, switching component 810 and passive load component 820 of each drive path 804 is disabled, while voltage regulator controller 806 and PWM driver 812 of each drive path 804 operate with dummy load component 1304 and switching components 1306.

In summary, when voltage regulator 402 is in the standby/redundancy mode, auxiliary loop 1302 is applied to decouple output interface 802 without entirely shutting down voltage regulator 402. Voltage regulator controller 806 and PWM drivers 812 of drive paths 804 are operational, allowing voltage regulator 402 to wake up promptly and maintain a desirable transient response time when it recovers from the standby/redundancy mode. Moreover, switching components 810 of drive paths 804 are decoupled and disabled, and dummy load component 1304 and switching components 1306 are designed to consume less power than switching components 810 and load components 820 of drive paths 804. This efficiently conserves power consumption of voltage regulator 402 in the standby/redundancy mode. Conversely, when auxiliary loop 1302 is not used to enable the standby/redundancy mode of voltage regulator 402, voltage regulator controller 806 and PWM drivers 812 of drive paths 804 are disabled to enable the standby/redundancy mode. Voltage regulator 402 is entirely shut down in the standby/redundancy mode, and has to restart each time when it is recovered from the standby/redundancy mode to contribute to the corresponding rail current $I_R$ of power rail 206 that needs to be powered by voltage regulator 402. A restart process is oftentimes slow and compromises a transient response time of voltage regulator 402 when it recovers from the standby/redundancy mode.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The above description has been provided with reference to specific implementations. However, the illustrative discussions above are not intended to be exhaustive or to be limiting to the precise forms disclosed. Many modifications and variations are possible in view of the above teachings. The implementations were chosen and described in order to best explain the principles disclosed and their practical applications, to thereby enable others to best utilize the disclosure and various implementations with various modifications as are suited to the particular use contemplated.

What is claimed is:

1. An integrated semiconductor device, comprising:
   a plurality of voltage regulators electrically coupled to a power rail and configured to provide a rail voltage collectively via the power rail, each of the plurality of voltage regulators further comprising:
   an output interface electrically coupled to the power rail;
   a first drive path coupled to the output interface and configured to operate during a first phase and with an operating frequency to provide a first path current to the power rail;
   a second drive path coupled to the output interface and configured to operate during a second phase and with the operating frequency to provide a second path current to the power rail, wherein the second drive path is electrically coupled in parallel with the first drive path;
   an intra-regulator balancing circuit coupled to the first and second drive paths, the intra-regulator balancing circuit configured to sense the first and second path currents and generate a first control signal to control a first duty cycle of the first phase and/or a second duty cycle of the second phase based on a difference of the first and second path currents;
   a voltage regulator controller having a feedback input coupled to the output interface, the voltage regulator controller's feedback input configured to receive an output voltage of the output interface; and
   an inter-regulator balancing circuit coupled to the output interface and the voltage regulator controller, the inter-regulator balancing circuit configured to sense an output current of the respective voltage regulator and apply an offset to a control input of the voltage regulator controller, wherein the offset is determined based on the sensed output current of the respective voltage regulator.

2. The integrated semiconductor device of claim 1, wherein the intra-regulator balancing circuit is configured to:
   determine that the difference of the first and second path currents does not satisfy a path current balancing criterion; and
   in accordance with a determination that the difference of the first and second path currents does not satisfy the path current balancing criterion and a determination that the first path current is greater than the second path current, implement one or both of reducing the first duty cycle of the first phase and increasing the second duty cycle of the second phase, until the difference of the first and second path currents satisfies the path current balancing criterion.

3. The integrated semiconductor device of claim 1, wherein the voltage regulator controller includes an error amplifier configured to receive the control input and apply the offset between the feedback input and a control value that defines the rail voltage.

4. The integrated semiconductor device of claim 1, each of the plurality of voltage regulators further comprising:
   an inter-regulator balancing circuit coupled to the output interface and the voltage regulator controller, the inter-regulator balancing circuit configured to sense one of the first and second path currents of the respective voltage regulator and apply an offset to a control input received by the voltage regulator controller, the offset based on the sensed one of the first and second path currents.

5. The integrated semiconductor device of claim 1, wherein each of the first and second drive paths further comprises:

a switching component coupled to an input supply voltage $V_{in}$ and the output interface; and a driver coupled to the switching component and configured to enable the switching component during a respective one of the first and second phases, at the operating frequency, thereby providing a respective one of the first and second path currents to the power rail.

6. The integrated semiconductor device of claim 1, wherein the first duty cycle of the first phase is equal to the second duty cycle of the second phase, and the second phase is offset from the first phase.

7. The integrated semiconductor device of claim 1, wherein:

the first control signal is generated to control the second duty cycle of the second phase based on the difference of the first and second path currents;

each of the plurality of voltage regulators further includes a third drive path coupled to the output interface and configured to operate during a third phase, at the operating frequency, to provide a third path current to the power rail, the third drive path electrically coupled in parallel with the first and second drive paths; and the intra-regulator balancing circuit is coupled to the third drive path and configured to sense the third path current and generate a second control signal to control a third duty cycle of the third phase based on a difference of the first and third path currents.

8. The integrated semiconductor device of claim 1, wherein:

each of the plurality of voltage regulators further includes a third drive path coupled to the output interface and configured to operate during a third phase, at the operating frequency, to provide a third path current to the power rail, the third drive path electrically coupled in parallel with the first and second drive paths; and the intra-regulator balancing circuit is coupled to the third drive path and configured to sense the third path current and generate the first control signal to control the first duty cycle of the first phase based on a difference of the first and second path currents and based on a difference of the first and third path currents.

9. The integrated semiconductor device of claim 1, each of the plurality of voltage regulators including:

a voltage regulator controller having an output coupled to the first and second drive paths and an input coupled to the output interface by a feedback path, and configured to control the first and second drive paths; and a bypass unit coupled to the first and second drive paths and the voltage regulator controller, the bypass unit configured to provide a dummy load component, wherein the respective voltage regulator has a standby/redundancy mode in which the bypass unit is enabled to bypass the feedback path from the output interface to the input of the voltage regulator controller.

10. The integrated semiconductor device of claim 9, wherein each of the first and second drive paths further comprises:

a passive load component coupled to the output interface;

a driver configured to receive a clock signal having an operating frequency and modulate the clock signal to provide a switching signal with a phase; and a power switching component coupled to the driver and the passive load component, the power switching component configured to couple the passive load component to one or more DC supply voltages under the control of the switching signal.

11. The integrated semiconductor device of claim 10, wherein in the standby/redundancy mode, the bypass unit is enabled to bypass the power switching component and the passive load component of each drive path, and each of the first and second drive paths further comprises:

a multiplexer coupled to the driver, the power switching component and the bypass unit, wherein the multiplexer is configured to select the bypass unit and deselect the power switching component and electrically couple the driver to the bypass unit in the standby/redundancy mode.

12. The integrated semiconductor device of claim 1, further comprising the power rail configured to provide the rail voltage.

13. An electronic system, comprising:

a power rail configured to provide a rail voltage; and a plurality of voltage regulators electrically coupled to the power rail and configured to provide the rail voltage collectively, each of the plurality of voltage regulators further comprising:

an output interface electrically coupled to the power rail;

a first drive path coupled to the output interface and configured to operate during a first phase and with an operating frequency to provide a first path current to the power rail;

a second drive path coupled to the output interface and configured to operate during a second phase and with the operating frequency to provide a second path current to the power rail, wherein the second drive path is electrically coupled in parallel with the first drive path; and an intra-regulator balancing circuit coupled to the first and second drive paths, the intra-regulator balancing circuit configured to sense the first and second path currents and generate a first control signal to control a first duty cycle of the first phase and/or a second duty cycle of the second phase based on a difference of the first and second path currents, wherein the plurality of voltage regulators and one or more additional voltage regulators are arranged in a field programmable array, and the plurality of voltage regulators are selected from the field programmable array to drive the power rail based on load information corresponding to an anticipated or actual load on the power rail.

14. The electronic system of claim 13, wherein the intra-regulator balancing circuit is configured to:

determine that the difference of the first and second path currents does not satisfy a path current balancing criterion; and in accordance with a determination that the difference of the first and second path currents does not satisfy the path current balancing criterion and a determination that the first path current is greater than the second path current, implement one or both of reducing the first duty cycle of the first phase and increasing the second duty cycle of the second phase, until the difference of the first and second path currents satisfies the path current balancing criterion.

15. The electronic system of claim 13, each of the plurality of voltage regulators further comprising:

a voltage regulator controller having a feedback input coupled to the output interface, the voltage regulator controller's feedback input configured to receive an output voltage of the output interface; and an inter-regulator balancing circuit coupled to the output interface and the voltage regulator controller, the inter-regulator balancing circuit configured to sense an output current of the respective voltage regulator and apply an offset to a control input of the voltage regulator controller, wherein the offset is determined based on the sensed output current of the respective voltage regulator.

16. The electronic system of claim 13, each of the plurality of voltage regulators further comprising:
a voltage regulator controller having a feedback input coupled to the output interface, the voltage regulator controller's feedback input configured to receive an output voltage of the output interface; and
an inter-regulator balancing circuit coupled to the output interface and the voltage regulator controller, the inter-regulator balancing circuit configured to sense one of the first and second path currents of the respective voltage regulator and apply an offset to a control input received by the voltage regulator controller, the offset based on the sensed one of the first and second path currents.

17. The electronic system of claim 13, wherein:
the first control signal is generated to control the second duty cycle of the second phase based on the difference of the first and second path currents;
each of the plurality of voltage regulators further includes a third drive path coupled to the output interface and configured to operate during a third phase, at the operating frequency, to provide a third path current to the power rail, the third drive path electrically coupled in parallel with the first and second drive paths; and
the intra-regulator balancing circuit is coupled to the third drive path and configured to sense the third path current and generate a second control signal to control a third duty cycle of the third phase based on a difference of the first and third path currents.

18. An integrated semiconductor device, comprising:
a plurality of voltage regulators electrically coupled to a power rail and configured to provide a rail voltage collectively via the power rail, each of the plurality of voltage regulators further comprising:
an output interface electrically coupled to the power rail;
a first drive path coupled to the output interface and configured to operate during a first phase and with an operating frequency to provide a first path current to the power rail;
a second drive path coupled to the output interface and configured to operate during a second phase and with the operating frequency to provide a second path current to the power rail, wherein the second drive path is electrically coupled in parallel with the first drive path; and
an intra-regulator balancing circuit coupled to the first and second drive paths, the intra-regulator balancing circuit configured to sense the first and second path currents and generate a first control signal to control a first duty cycle of the first phase and/or a second duty cycle of the second phase based on a difference of the first and second path currents;
a voltage regulator controller having an output coupled to the first and second drive paths and an input coupled to the output interface by a feedback path, and configured to control the first and second drive paths; and
a bypass unit coupled to the first and second drive paths and the voltage regulator controller, the bypass unit configured to provide a dummy load component, wherein the respective voltage regulator has a standby/redundancy mode in which the bypass unit is enabled to bypass the feedback path from the output interface to the input of the voltage regulator controller.

19. The integrated semiconductor device of claim 18, wherein each of the first and second drive paths further comprise:
a passive load component coupled to the output interface;
a driver configured to receive a clock signal having an operating frequency and modulate the clock signal to provide a switching signal with a phase; and
a power switching component coupled to the driver and the passive load component, the power switching component configured to couple the passive load component to one or more DC supply voltages under the control of the switching signal.

20. The integrated semiconductor device of claim 19, wherein in the standby/redundancy mode, the bypass unit is enabled to bypass the power switching component and the passive load component of each drive path, and each of the first and second drive paths further comprises:
a multiplexer coupled to the driver, the power switching component and the bypass unit, wherein the multiplexer is configured to select the bypass unit and deselect the power switching component and electrically couple the driver to the bypass unit in the standby/redundancy mode.

* * * * *